(12) United States Patent
Satyan et al.

(10) Patent No.: US 11,187,807 B2
(45) Date of Patent: Nov. 30, 2021

(54) PRECISELY CONTROLLED CHIRPED DIODE LASER AND COHERENT LIDAR SYSTEM

(71) Applicant: Intel Corporation, Santa Clara, CA (US)

(72) Inventors: Naresh Satyan, Pasadena, CA (US); George Rakuljic, Santa Monica, CA (US)

(73) Assignee: Intel Corporation, Santa Clara, CA (US)

( * ) Notice: Subject to any disclaimer, the term of this patent is extended or adjusted under 35 U.S.C. 154(b) by 657 days.

(21) Appl. No.: 16/032,535

(22) Filed: Jul. 11, 2018

(65) Prior Publication Data

US 2019/0025431 A1    Jan. 24, 2019

Related U.S. Application Data

(60) Provisional application No. 62/675,567, filed on May 23, 2018, provisional application No. 62/536,425, filed on Jul. 24, 2017.

(51) Int. Cl.
| | |
|---|---|
| *G01C 3/08* | (2006.01) |
| *G01S 17/89* | (2020.01) |
| *G01S 7/481* | (2006.01) |
| *G01S 7/4915* | (2020.01) |
| *G02F 1/21* | (2006.01) |

(Continued)

(52) U.S. Cl.
CPC .......... *G01S 17/89* (2013.01); *G01S 7/4812* (2013.01); *G01S 7/4817* (2013.01); *G01S 7/497* (2013.01);

(Continued)

(58) Field of Classification Search
CPC ...... G01S 7/4817; G01S 7/4812; G01S 7/497; G01S 7/4914; G01S 7/4911;

(Continued)

(56) References Cited

U.S. PATENT DOCUMENTS

| 8,175,126 B2 | 5/2012 | Rakuljic et al. |
| 9,559,486 B2 * | 1/2017 | Roos ............ H01S 3/1305 |

(Continued)

FOREIGN PATENT DOCUMENTS

| JP | 2013002949 A  * | 1/2013 | ........ G01S 7/4008 |

OTHER PUBLICATIONS

Jedrzejczyk et al., "High-power distributed-feedback tapered master-oscillator power amplifiers emitting at 1064 nm", Journal, https://www.spiedigitallibrary.org/conference-proceedings-of-spie, last accessed Jun. 22, 2018, 11 total pages.

(Continued)

*Primary Examiner* — Mark Hellner
(74) *Attorney, Agent, or Firm* — Viering, Jentschura & Partner Mbb

(57) ABSTRACT

Frequency modulated lasers, LIDAR systems, and methods of controlling laser are disclosed. A laser source emits an optical beam having an optical frequency that changes in response to a signal applied to an input of the laser source. A laser driver that generates the signal applied to the input to cause the optical frequency to vary in accordance with a periodic frequency versus time function. The laser driver generates the signal for a current period of the periodic frequency versus time function based, at least in part, on optical frequency versus time measurements of one or more prior periods of the periodic frequency versus time function.

23 Claims, 17 Drawing Sheets

(51) Int. Cl.
  *H01S 5/026*    (2006.01)
  *G01S 7/4914*    (2020.01)
  *G01S 7/4911*    (2020.01)
  *H01S 5/10*    (2021.01)
  *G01S 17/42*    (2006.01)
  *G01S 7/497*    (2006.01)
  *G01S 17/34*    (2020.01)
  *H01S 5/12*    (2021.01)
  *H01S 5/50*    (2006.01)
  *H01S 5/00*    (2006.01)

(52) U.S. Cl.
  CPC ........... *G01S 7/4911* (2013.01); *G01S 7/4914* (2013.01); *G01S 7/4915* (2013.01); *G01S 17/34* (2020.01); *G01S 17/42* (2013.01); *G02F 1/21* (2013.01); *H01S 5/0261* (2013.01); *H01S 5/0265* (2013.01); *H01S 5/1014* (2013.01); *G01S 7/4818* (2013.01); *G02F 1/212* (2021.01); *H01S 5/0064* (2013.01); *H01S 5/1212* (2013.01); *H01S 5/5027* (2013.01)

(58) Field of Classification Search
  CPC .... G01S 7/4915; G01S 7/4818; H01S 5/1014; H01S 5/0265; H01S 5/0261; H01S 5/5027; H01S 5/0064; H01S 5/1212; G02S 17/89; G02S 17/34; G02S 17/42
  See application file for complete search history.

(56) References Cited

U.S. PATENT DOCUMENTS

| | | | |
|---|---|---|---|
| 9,864,060 B2 * | 1/2018 | Sebastian | G01C 3/08 |
| 2007/0273863 A1 * | 11/2007 | Leep | G01S 7/497 |
| | | | 356/5.15 |
| 2016/0299228 A1 | 10/2016 | Maleki et al. | |
| 2018/0031678 A1 | 2/2018 | Singer et al. | |

OTHER PUBLICATIONS

Lang et al., "Numerical Analysis of Flared Semiconductor Laser Amplifiers", Journal, IEEE Journal of Quantum Electronics, vol. 29, No. 6, Published Jun. 1993, 8 total pages.

A. Dieckmann, "FMCW-LIDAR with tunable twin-guide laser diode", Journal, Electronic Letters, vol. 30, No. 4, published Feb. 17, 1994, 2 pages.

Choma et al., "Swept source optical coherence tomography using an all-fiber 1300-nm ring laser source", Journal, Journal of Biomedical Optics 10(4), 044009, published Jul./Aug. 2005, 6 total pages.

Dubey et al., "Fingerprint detection using full-field swept-source optical coherence tomography", Journal, Appl. Phys. Lett. 91, 181106 (2007), published Oct. 30, 2007, 4 total pages.

Ndiaye et al., "Profilometry using a frequency-shifted feedback laser", Journal, 2005 Conference on Lasers & Electro-Optics (CLEO), published Jan. 16, 2006, 3 pages.

Amann et al., "Laser ranging: a critical review of usual techniques for distance measurement", Journal, Opt. Eng. 40(1)10-19, published Jan. 1, 2001, 10 total pages.

Leung et al., "High-power wavelength-swept laser in Littman telescope-less polygon filter and dual-amplifier configuration for multichannel optical coherence tomography", Journal, Optics Letters / vol. 34, No. 18, published Sep. 15, 2009, 3 pages.

Marron et al., "Three-dimensional imaging using a tunable laser source", Journal, Opt. Eng. 39(1) 47-51, https://www.spiedigitallibrary.org/journals/Optical-Engineering, last accessed Jun. 22, 2018, 5 pages.

Satyan et al., Precise control of broadband frequency chirps using optoelectronic feedback, Journal, Optics Express 15991, vol. 17, No. 18, published, Aug. 31, 2009, 9 pages.

Santis et al., High-coherence semiconductor lasers based on integral high-Q resonators in hybrid Si/III-V platforms, Journal, PNAS, vol. 111, No. 8, published Feb. 25, 2014, pp. 2879-2884.

* cited by examiner

PRECISELY CONTROLLED CHIRPED DIODE LASER AND COHERENT LIDAR SYSTEM

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority from provisional patent application No. 62/675,567, filed May 23, 2018, titled HIGH-SPEED COHERENT LIDAR, and provisional patent application No. 62/536,425, filed Jul. 24, 2017, titled COHERENT CHIRPED LIDAR FOR 3D IMAGING, the contents of both are incorporated by reference herein in their entirety.

BACKGROUND

Field

This disclosure relates to three-dimensional (3D) image systems and, specifically, to coherent Light Detection and Ranging (LIDAR) imaging systems.

Description of the Related Art 3D imaging systems are critical for a number of applications in the automotive industry, robotics, unmanned vehicles etc. Traditionally, pulsed LIDAR systems relying on the time of flight (TOF) technique have been investigated for these applications, wherein the range to a target is determined by measuring the time taken by a single narrow pulse to be reflected from a distant target. TOF LIDAR suffers from some major challenges and limitations. Since the amount of light reflected from distant targets is very small (typically under 100 photons in the measurement time) and the pulse width needs to be very small (<1 ns) to achieve high range accuracy, these systems require sophisticated detectors, typically high-speed photon-counters. The TOF technique places very stringent requirements on the dynamic range of the detector and associated electronics (typically about 60 dB, or 20 bits). Further, these very sensitive detectors often have difficulty dealing with crosstalk from other LIDAR systems or from other sources of light (including direct sunlight) when operated in real-world situations.

Coherent LIDAR is a promising 3D imaging technology because of its potential to achieve excellent performance on a number of key metrics: high-speed (>1 million points/second), long-range (>200 m for targets with albedo of 0.1), high lateral resolution (<0.1 degrees), and fine range precision (<10 cm). FIG. 1 is a simplified block diagram of an exemplary coherent LIDAR system 100. The LIDAR system 100 is based on the frequency modulated continuous wave (FMCW) technique, where the frequency of a continuous wave (CW) laser is "chirped" or changed in accordance with a predetermined periodic frequency versus time function. The periodic frequency versus time function may be a positive linear sawtooth function where the frequency starts at a baseline value, increases linearly over a time period, resets to the baseline value, and repeats periodically. The periodic frequency versus time function may be a negative linear sawtooth function where the frequency starts at a baseline value, decreases linearly over a time period, resets to the baseline value, and repeats periodically. The periodic frequency versus time function may be a linear triangular function where the frequency starts at a baseline value, increases linearly over a time period, decreases linearly back to the baseline value over a second time period, and repeats periodically. The periodic frequency versus time function may be some other linear or nonlinear function. The system 100 includes a semiconductor diode laser 100 to produce the chirped waveform. This device will be referred to in this patent as a Chirped Diode Laser (CHDL).

The output of the CHDL 110 is divided into two components by a tap coupler 120. A small fraction is separated from the output to be used as a Local Oscillator (LO) wave 125. The majority (typically >90%) of the CHDL output power is directed to a target 160 via a circulator 130. Typically, an optical system (not shown), such as a telescope, is used to form the CHDL output into a collimated output beam 135 that illuminates the target 160. Light reflected from the target 140 is collected by the same optical system (not shown) and returned to the circulator 130. The reflected light exits the circulator 130 and is combined with the local oscillator wave 125 in a 2×1 coupler 145. The combined LO wave and the reflected light from the target are incident on a photodetector (PD) 150. The photodetector 150 provides an output current proportional to the incident optical power. The photodetector 150 effectively multiplies the amplitudes of the reflected light and the LO wave to create a coherent "beat signal" whose frequency is directly proportional to the round-trip time delay to the target, and the range to the target is thus determined.

While FIG. 1 is drawn is if the optical paths between the CHDL, couplers, circulator and photodetector are optical fibers, this is not necessarily the case. The couplers and circulator can be implemented using discrete optical elements and the optical paths between these elements may be in free space.

FIG. 2A is a graph of optical frequency versus time which illustrates the operation of a coherent LIDAR system, such as the coherent LIDAR system 100. In this example, the optical frequency of the output wave from a chirped diode laser (CHDL) follows a positive linear sawtooth function where the optical frequency during each chirp period T is given by $$\omega = \omega_0 + \xi t, \qquad (1)$$

where $\omega$=optical frequency of the laser output wave;
$\omega 0$=a baseline frequency at the start of each chirp;
$\xi$=a chirp rate measured in frequency per unit time; and
t=time.

The optical frequency of the reflected wave from a target follows a similar function, but is offset in time from the output wave by a period given by $$\tau = 2R/c \qquad (2)$$

where $\tau$=the time interval between the output and reflected chirps=the round-trip time to the target;
R=the range the target; and
c=the speed of light.
The chirp period T must be longer than the round trip time to the target $\tau$ to provide a measurement interval $T_M$. The required length of the measurement interval $T_M$ is determined by, among other factors, the signal-to-noise ratio of the reflected beam. At any given time during the measurement interval $T_M$, the frequency difference $\Delta\omega$ between the output and reflected waves is given by:

$$\Delta\omega = \xi\tau. \tag{3}$$

FIG. 2B is a graphical representation of the mixing of a LO wave and a reflected wave incident on a photodetector. The output current from the photodetector is given by $$i \approx (P_{LO}P_{Ref})^{1/2} \cos(\Delta\omega t + \omega_0\tau) \tag{4}$$

where i=current output from the photodetector; and
$P_{LO}$, $P_{REF}$=power of the LO and reflected waves.
$\Delta\omega$ can be determined by processing the output current from the photodetector. For example, the current value may be digitized with a sample rate substantially higher than the anticipated value of $\Delta\omega$. A Fourier transform or other process may be performed on the digitized samples to determine $\Delta\omega$. Alternatively, $\Delta\omega$ may be determined by a bank of hardware filters or some other technique. The range R to the target may then be determined by $$R = \Delta\omega c/2\xi \tag{5}$$

where c=the speed of light.
The resolution of the range measurement is given by $$\delta \approx c/2B \tag{6}$$

where $\delta$ = resolution in the range direction, and

B = frequency change during chip period in cycles/sec.

= $\xi T/2\pi$.

A coherent LIDAR system can determine both a range to a target and a rate of change of the range (range rate) to the target. FIG. 3 is a graph of optical frequency versus time which illustrates determining a rate of change of the range to a target. The reflected beam from a moving target will be subject to a Doppler frequency shift given by $$\omega_D = 2\pi/\lambda(dR/dt) \tag{7}$$

where $\omega D$=Doppler frequency shift in the reflected beam;
$\lambda$=the laser wavelength; and
dR/dt=the rate of change of the range to the target.
When a target is illuminated with a laser beam with an up-chirp (i.e., a beam that increases in frequency with time), the Doppler shift and the frequency shift due to the delay of the reflected beam are additive, such that $$\Delta\omega^+ = \omega D + \xi\tau; \tag{8}$$

where $\Delta\omega^+$=the frequency difference between the output and reflected waves for an up-chirp.
When a target is illuminated with a laser beam with a down-chirp (i.e., a beam that decreases in frequency with time), the Doppler shift and the frequency shift due to the delay of the reflected beam are subtractive, such that $$\Delta\omega^- = \omega D - \xi\tau; \tag{9}$$

where $\Delta\omega^-$=the frequency difference between the output and reflected waves for a down-chirp.
Illuminating a target with both an up-chirp beam and a down-chirp beam, concurrently or sequentially, allows determination of both range and range-rate. For example, the optical frequency of a single CHDL can be modulated to follow a linear triangular function, as shown in FIG. 3, to provide sequential up-chirp and down-chirp measurements. Simultaneous determination of range and range rate is a major advantage of coherent LIDAR systems that enables faster and better target tracking in a variety of applications.

Throughout this description, elements appearing in figures are assigned three-digit or four-digit reference designators, where the two least significant digits are specific to the element and the most significant digit or digits provide the number of the figure where the element is introduced. An element that is not described in conjunction with a figure may be presumed to have the same characteristics and function as a previously-described element having the same reference designator.

DETAILED DESCRIPTION

Description of Apparatus

The key requirement for a coherent chirped LIDAR system is a laser whose optical frequency varies with time in a precisely controlled fashion. LIDAR systems commonly incorporate semiconductor diode lasers and attempt to control the laser to produce a precisely linear chirped wave. However, the principles described in this patent can be more generally applied to any type of laser whose output frequency can be varied by changing one or more input parameters. These principles can also be applied to generating nonlinear chirps.

Feedback-controlled chirped diode lasers measure the frequency output characteristic of the laser and use the measurement to provide closed-loop feedback to control the laser output frequency. However, measuring and controlling the rate of change of the laser output frequency typically requires a finite time interval. For example, a fraction of the laser output power may be transmitted through an unbalanced (or asymmetric) Mach-Zehnder interferometer (MZI) and onto a photodetector. The output frequency of the beat signal produced by the MZI-photodetector is directly proportional to the slope of the frequency chirp (i.e., the rate of change of frequency with time). By comparing this beat frequency to a desired beat frequency (corresponding to a desired frequency chirp rate), an error signal can be generated and fed back to the laser (typically after additional filtering). This closed-loop system can generate a precisely controlled linear chirp, but only works well if the chirp duration and the LIDAR measurement time are substantially longer that the time interval needed to measure and control the slope of the frequency chirp.

The chirp rate of high-speed coherent LIDAR systems is dictated by the required resolution and image update rate. Some systems may use chirp durations or measurement times less than 1 microsecond. Closed-loop laser control, as described in the preceding paragraph, does not work for these high speed LIDAR systems, because the propagation delays in the feedback system (such as optical delays in the unbalanced MZI and the response time of the laser and any loop filters) are comparable to or larger than the chirp duration itself.

Figure 2A:
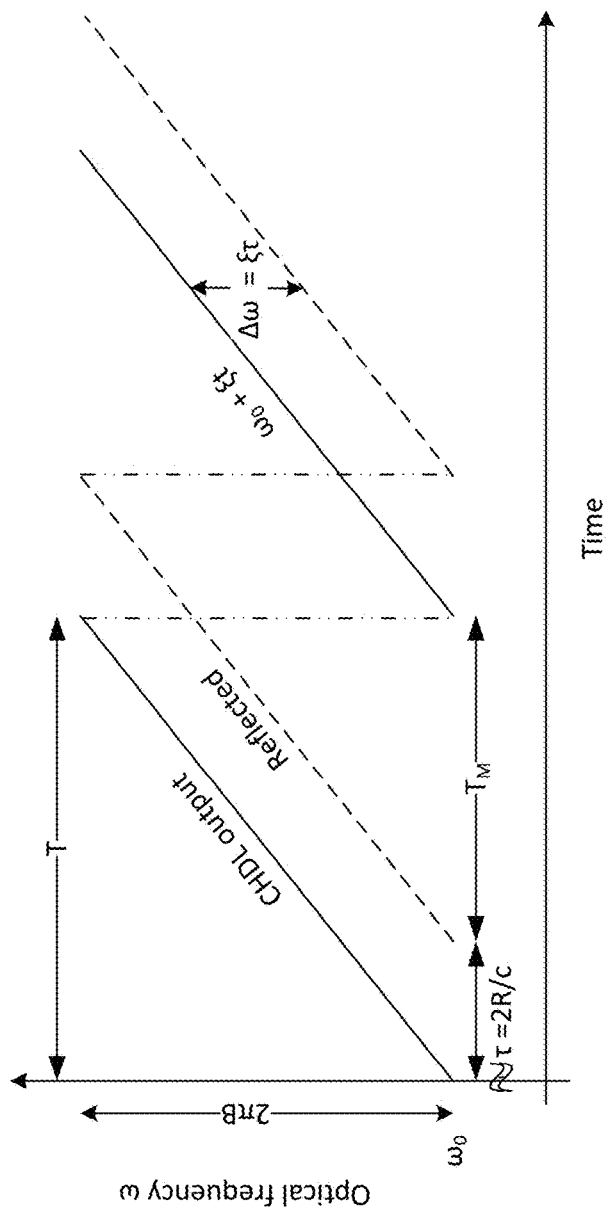
FIG. 2A is a graph of optical frequency versus time illustrating the operation of a coherent LIDAR system.

The transmitter output in a coherent LIDAR system is a sequence of identical (at least in theory) frequency chirps that repeat periodically, as shown in FIG. 2A. Environmental fluctuations, such as temperature changes, that cause the laser performance to change with time typically have a time constant that is much larger than the chirp repetition period. Thus it is possible to control a future chirp based on measurements taken on one or more previous chirps, so long as the delay of the control system is smaller than the time constant of any environmental fluctuations.

Figure 4:
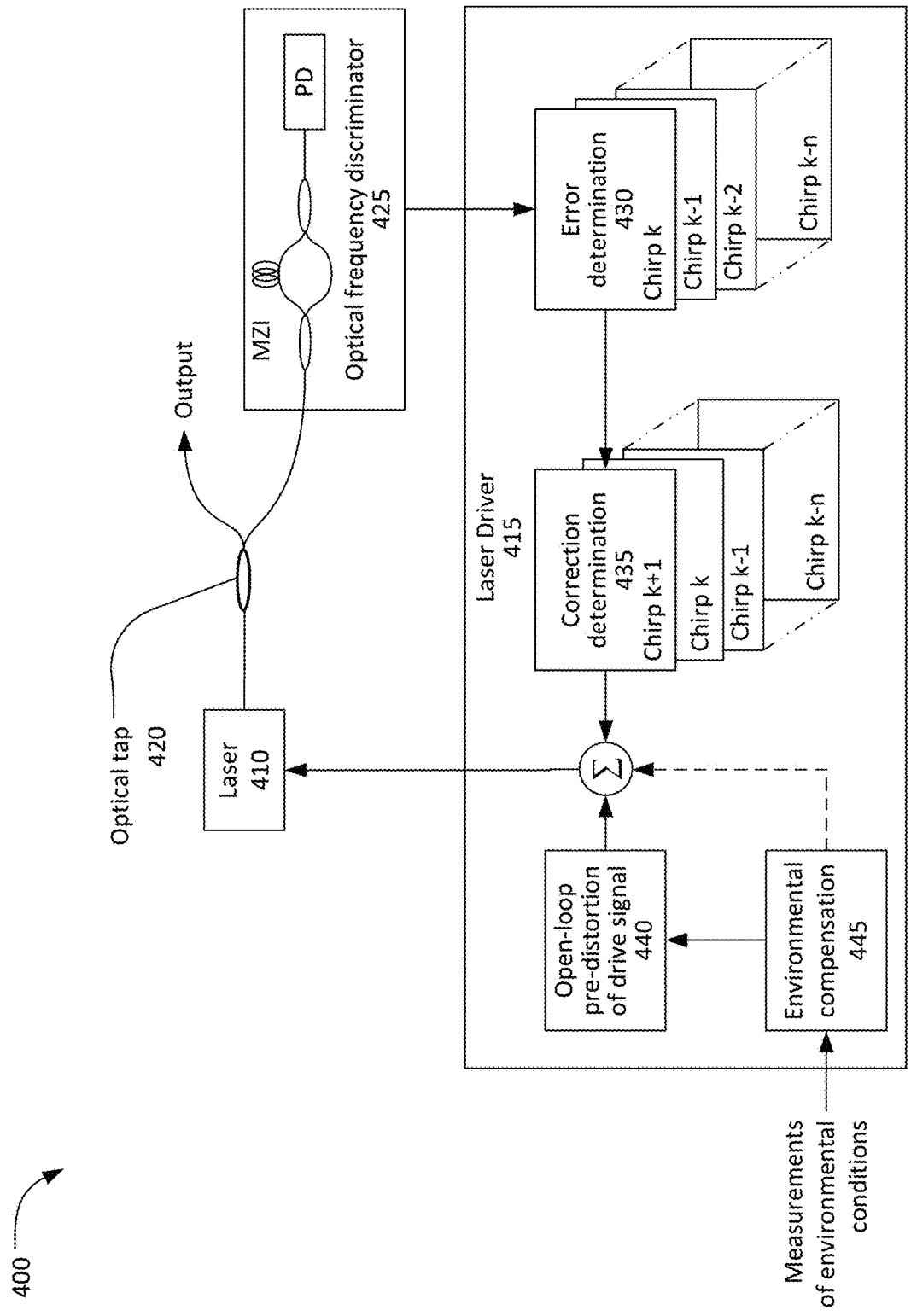
FIG. 4 is a block diagram of a state machine chirped diode laser.

FIG. 4 is a block diagram of a frequency modulated laser 400 suitable for use in a high speed LIDAR system. The system includes a laser device 410 that is driven by a laser driver circuit 415 that controls the frequency of the laser output. The laser device 410 may be a diode laser, in which case the laser driver 415 controls the output frequency of the laser 410 by varying an electrical current provided to an input of the laser 410. The laser device 410 may be some other type of laser, in which case the laser driver 415 may control the output frequency of the laser 410 by varying one or more other parameters.

A portion of the output beam from the laser 410 is extracted by an optical tap 420 and applied to an optical frequency discriminator 425 that provides a measurement of the rate of change of the output frequency of the laser output. The optical tap 420 may be a tap coupler as shown, an asymmetric beam splitter, or some other device that extracts a small portion of the laser output. The optical frequency discriminator may be, for example, an asymmetric MZI and photodetector as shown in FIG. 4. In this case, the output of the photodetector is a signal having a frequency proportional to the rate of change of the laser frequency (the asymmetric MZI and photodetector operate exactly as described for the coherent LIDAR system 100, with the "range" to the target determined by the difference in the length of the two legs of the MZI). When the output of the laser 410 is a perfectly linear chirp, the signal output from the photodetector will be a constant predetermined frequency. When the output of the laser deviates from a linear chirp, a corresponding deviation will occur in the frequency of the signal output from the photodetector. A technique other than an asymmetric MZI and photodetector may be used for the optical frequency discriminator 425.

An error determination module 430 receives the output from the optical frequency discriminator 425, and determines the deviation of the laser frequency from its intended value as a function of time during the chirp period. The error determination may be performed by hardware and/or by a processor executing a method, such as a Hilbert transform, implemented in software. The error determination for the present chirp ("chirp k") is provided to a correction determination module 435 that determines a correction to be applied to the drive signal for a subsequent chirp k+1 or, more generally, a future chirp period, where the delay between the measurements and the future time period is less than the time constant of any environmental fluctuations. The correction module 435 may determine the correction to be applied to the future chirp using hardware and/or a processor executing a method implemented in software. The correction determination module 435 may determine the correction to be applied to the future chirp based upon the error determination and/or the correction for one or more prior chirps. For example, the correction determination module 435 may determine the correction to be applied to the future chirp based, at least in part, on a weighted sum or weighted average of the determined errors for two or more prior periods of the periodic frequency versus time function. The correction determination module 435 may determine the correction to be applied to the future chirp based, at least in part, on digital or analog filtering of the determined errors for one or more prior periods of the periodic frequency versus time function.

The laser 400 will be subsequently refer to as a "state machine CHDL" because where the information about the current "state" of the chirp is fed back to influence the future state of the chirp.

Although not shown in FIG. 4, the laser frequency error can be determined from multiple and adaptively varying measurements and/or filters. For example, the free spectral range of the asymmetric MZI may be varied to measure large discrepancies when the system is turned on (or when a parameter such as temperature is changed), but switched to higher sensitivities to measure small errors when the system is at or near steady state. Further, the drive signal fed into the laser may also include open-loop pre-distortion to compensate for known nonlinearities in the laser characteristics and/or environmental compensation for known changes to the environment, such as a separate measurement of the temperature of the LIDAR system (which generates a known shift in laser operating parameters). The use of open-loop pre-distortion and/or environmental compensation may allow the laser 400 to reach a steady state quicker when the system is turned on or when an environmental parameter such as temperature is changed.

Figure 3:
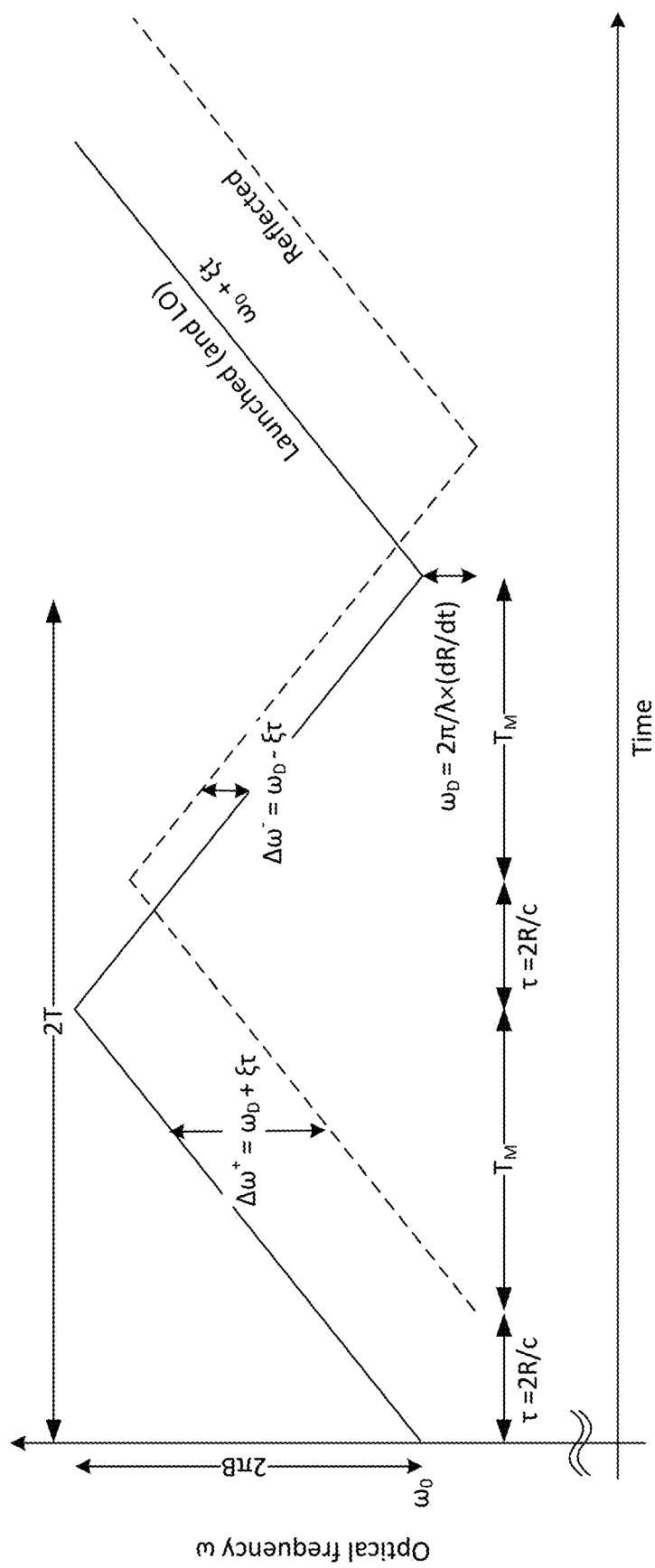
FIG. 3 is a is a graph of optical frequency versus time illustrating determination of range and range-rate based on Doppler shift.

As illustrated in FIG. 3, the time required to obtain the range (R) and range rate (dR/dt) information for a single target pixel (picture element) using a conventional FMCW approach is 2T, where the one-sided chirp duration T is the sum of the round trip time delay $\tau=2R/c$ and the measurement time $T_M$. The signal to noise ratio (SNR) required for good target detection determines the value of $T_M$, and $T_M$ can be reduced by adjusting system parameters such as CHDL power or receiver collection aperture. After a time (2T), the beam is scanned to the next pixel on the target. The total number of pixels that can be measured in a given time, termed the "3D imaging rate" (3D-IR) is (½T) pixels per second.

It is desirable that the 3D-IR be as high as possible. For the standard system of FIG. 1, even if the measurement time $T_M$ is made very small, the 3D imaging rate is limited by the maximum round trip transit time in the scene, i.e., $$3\text{D-IR} < 1/2\tau_{max} = c/4R_{max}. \qquad (8)$$

This is a limitation imposed by the finite speed of light c. For example, for a maximum range of 300 m, the 3D imaging rate is limited to 0.25 million pixels per second. This limitation may not be acceptable in some applications.

Figure 1:
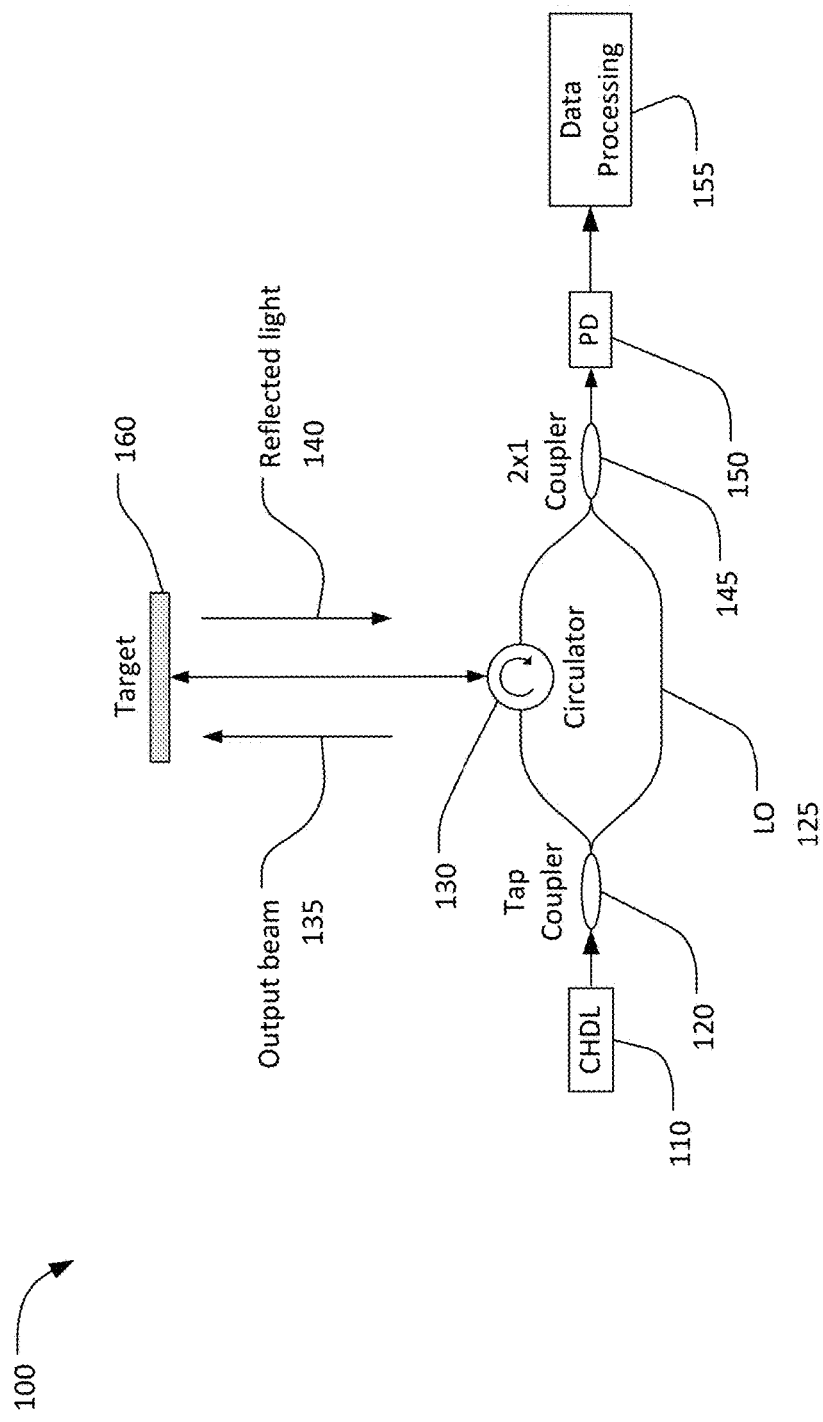
FIG. 1 is a simplified block diagram of a coherent LIDAR system.
Figure 2B:
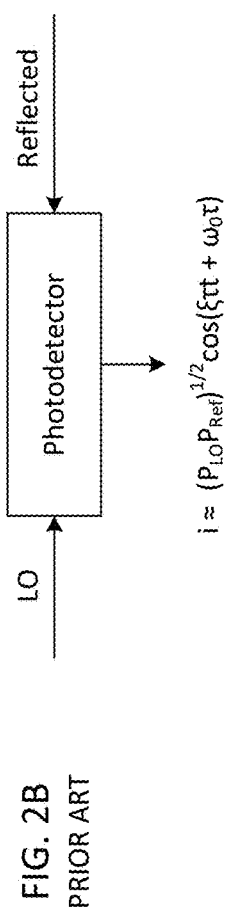
FIG. 2B is a graphical representation of the output current from a photodetector.
Figure 5:
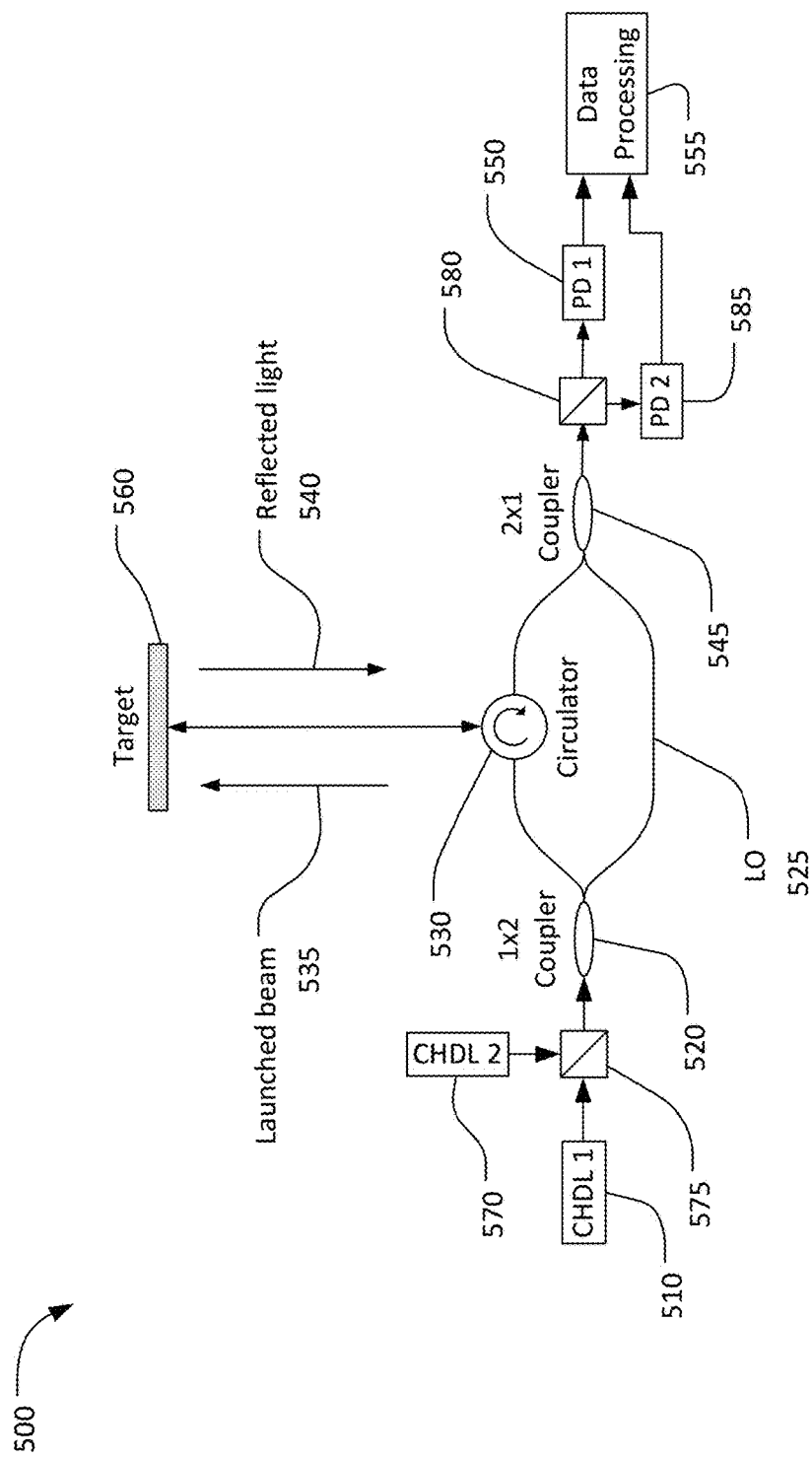
FIG. 5 is a block diagram of a coherent LIDAR system using two chirped lasers to concurrently measure range and range rate.

The "speed of light limit" on the 3D imaging rate can be overcome with two improvements to the basic coherent LIDAR system of FIGS. 1, 2, and 3. The first improvement, as incorporated into the LIDAR system 500 of FIG. 5, is to use two CHDLs 510, 570 to simultaneously illuminate the same pixel on the target, with the frequencies of the CHDLs chirping in opposite directions. For example, the frequency of the first CHDL 510 may follow a positive sawtooth function and the frequency of the second CHDL 570 may follow a negative sawtooth function. Alternatively, the frequency of the first CHDL 510 may follow a triangle function and the frequency of the second CHDL 570 may follow a triangle function shifted 180 degrees (shifted in time by one chirp period T) compared to the first CHDL. This enables the up and down measurements of FIG. 3 to be performed simultaneously.

In the LIDAR system 500, elements with reference designators from 510 to 560 have the same function as the counterpart elements in the LIDAR system 100 and will not be further described. The LIDAR system 500 includes second CHDL 570, which is chirped in the opposite direction as the first CHDL 510. The first and second CHDLs 510, 570 may be multiplexed by a beam combiner 575. For example, the first and second CHDLs 510, 570 may have orthogonal polarization, and the beam combiner 575 may be a polarization beam splitter. The first and second CHDLs 510, 570 may have different wavelengths, and the beam combiner 575 may be a dichroic beam splitter. In any case, the beams from the first and second CHDLs 510, 570 are combined and directed to the target 560. The reflected beams from the target are separated by beam divider (using polarization or wavelength as appropriate) are directed to separate detectors 550, 585. With this approach, the time to obtain R and dR/dt for a pixel is T, and the 3D imaging rate is (1/T) pixels per second. Again, by minimizing the measurement time $T_M$, the limitation on 3D-IR is 0.5 million pixels per second for a maximum range of 300 meters. A 3D-IR of 0.5 million pixels per second, while twice the rate of conventional coherent LIDAR systems, may still not be sufficient for some application.

Figure 6:
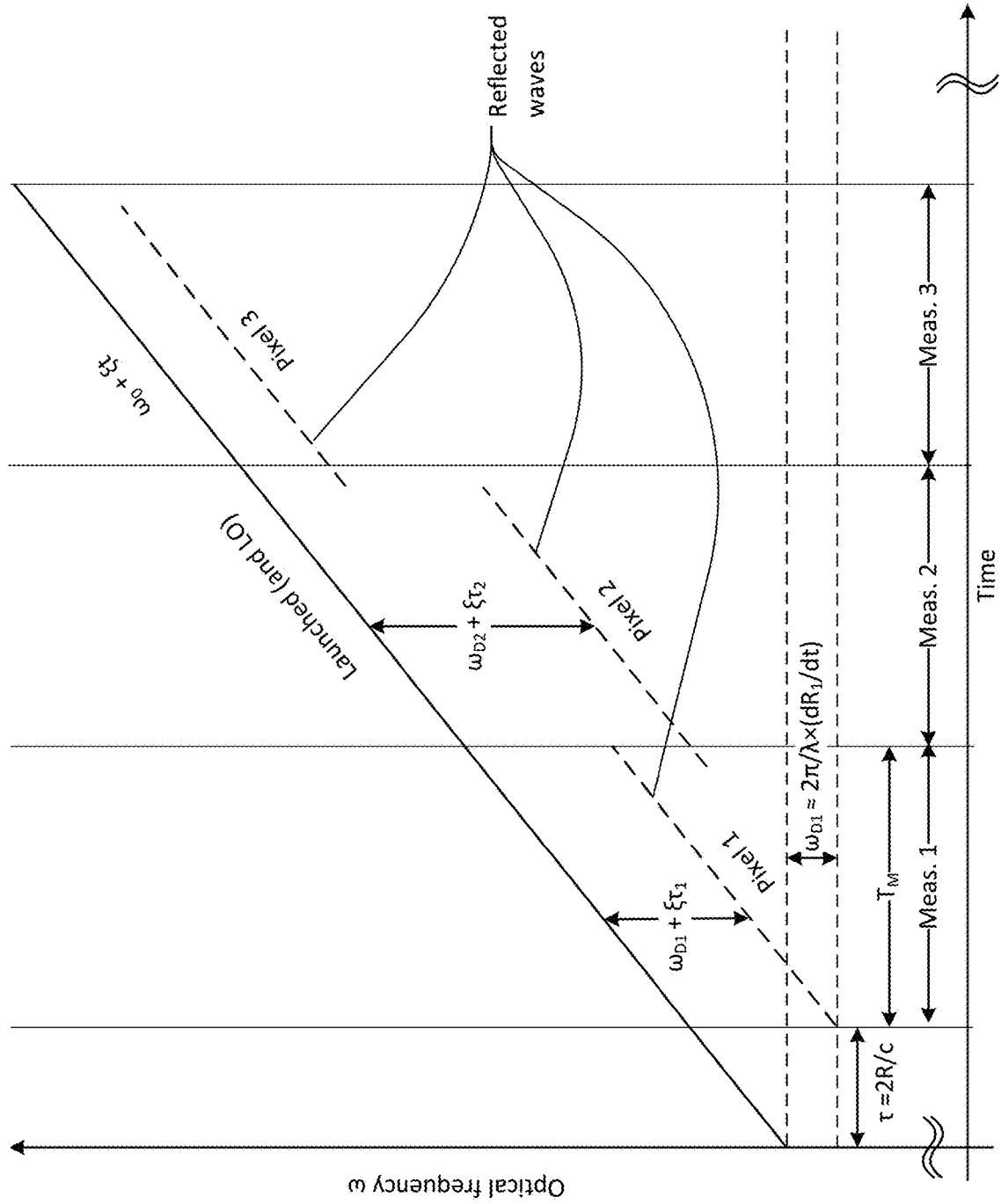
FIG. 6 is a graph of optical frequency versus time illustrating multiple measurements during a single laser chirp.

The next improvement in the conventional coherent LIDAR system results from recognition that the speed of light fundamentally imposes a delay or latency in the measurement, rather than a restriction on the imaging rate. The improvement to overcome the speed of light limit is to not reset the chirp after every pixel, but instead to use a chirp with longer extent T' that spans a number of (scanned) pixels as shown in FIG. 6. The example of FIG. 6 illustrates the chirp extended over three pixels, with the reflection from each pixel measured during a respective measurement time. The previously described state machine CHDL can provide a precisely controlled linear chirp over a frequency range sufficient to allow a single chirp to span hundreds of scanned pixels. In this case, the effective 3D-IR≈1/$T_M$, which is solely limited by the measurement time and not the round-trip time to the target. Different pixels are effectively measured using chirped waves with different optical frequencies, which eliminates any ambiguity in their range measurements, and allows faster measurements than are possible with the conventional coherent LIDAR systems.

As shown in FIG. 6, the returns from different pixels can have different time delays and Doppler shifts. This does not pose a major problem, and can be accounted for by straightforward methods. In one approach to resolving the measurements of multiple pixels, a detector that measures the return signal from multiple pixels as the illumination beam is scanned across them is used in conjunction with sliding-window Fourier transforms that resolve the ambiguity in the data processing. In another approach, a multiplicity of detectors is used along with the beam-scanning element. This embodiment takes advantage of the fact that the returned beam "lags" the illumination beam in a scanning system, creating a spatial separation between the two. The spatial separation is larger for farther ranges compared to nearer targets, and this fact is exploited by using a multiplicity of spatially staggered detectors where each one only measures the return signal from a subset of target ranges.

LIDAR systems impose a stringent requirement on the number of photons that need to be collected by the coherent receiver in order to achieve accurate measurements of range and range-rate. The number of photons collected is determined by the transmitted laser power, the reflectivity of the target, and the size of the receiver collection optics. Long-range (i.e., longer than 100 meters) LIDAR systems benefit from the use of high output powers (e.g., 100 mW to 10 W) to minimize the size and complexity of the collection optics used in the coherent receiver. However, long-range coherent LIDAR systems also require very narrow laser line width, which is generally incompatible with high laser output power. Semiconductor lasers with narrow line widths typically have output powers less than 100 mW.

A semiconductor laser may be used in conjunction with a semiconductor optical amplifier (SOA) or flared tapered amplifier in order to achieve the desired higher output powers while maintaining the required narrow line width. The output of a narrow line width master oscillator, which may be a state machine CHDL, may be fed into an optical amplifier, typically in a semiconductor medium. However, the optical and spectral properties of the oscillator can be affected by optical feedback effects and coupling of amplified spontaneous emission (ASE) from the amplifier section to the oscillator, which can dramatically increase the line width. Thus, a feedback barrier may be disposed between the CHDL and the amplifier to ensure that the line width and other properties of the CHDL are not affected by feedback from the amplifier section. The feedback barrier may be, for example, an optical isolator or an attenuator. A master-oscillator power-amplifier (MOPA) laser with a broad-area or flared/tapered amplifier can provide single-mode operation at high (i.e., greater than 10 W) output power on a single integrated semiconductor chip.

Figure 7:
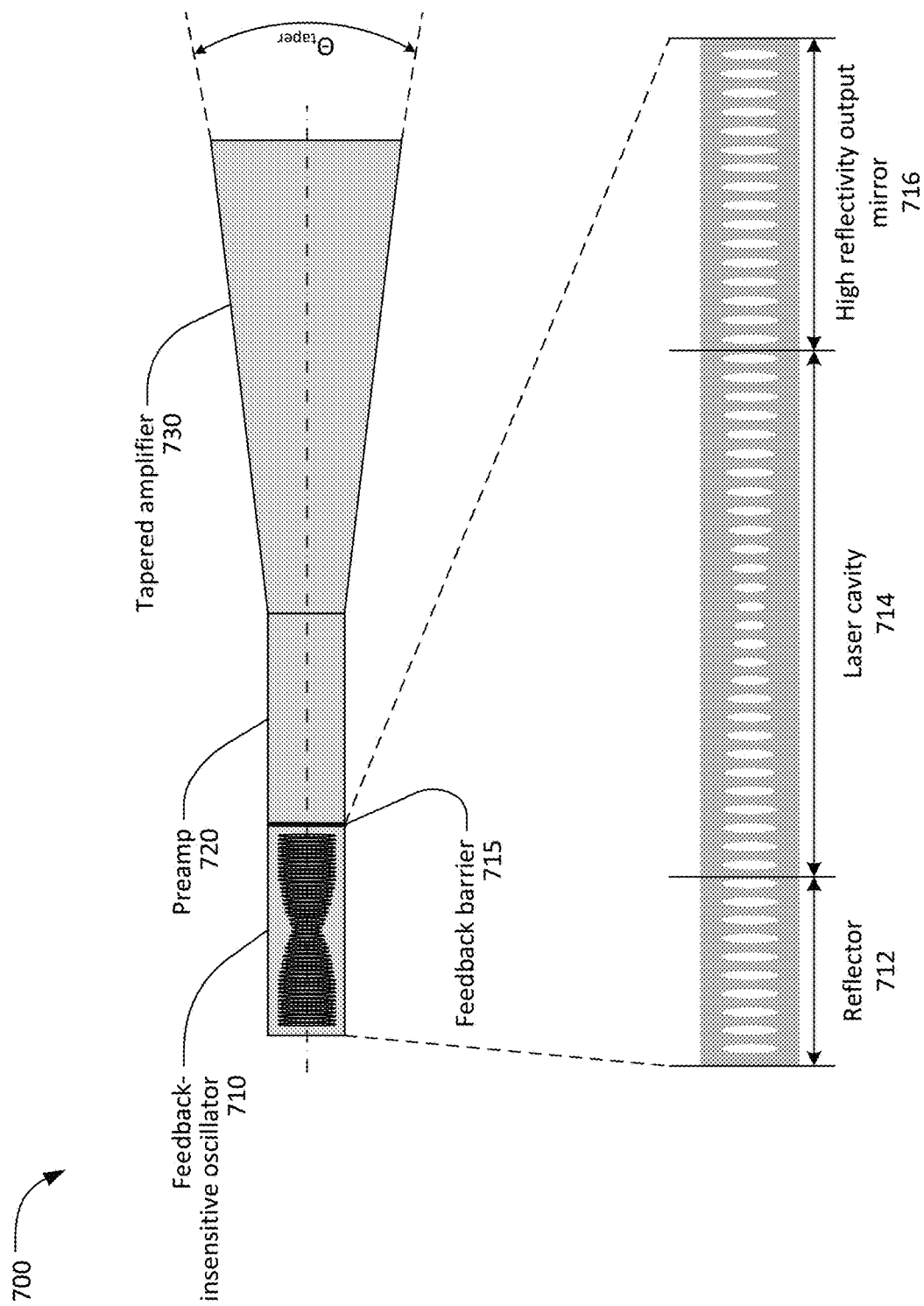
FIG. 7 is a graphical representation of an amplified chirped laser for long range LIDAR systems.

FIG. 7 is a schematic diagram of a narrow line width, high power, MOPA laser 700 suitable for use in long range coherent LIDAR systems. The MOPA laser 700 includes a feedback insensitive oscillator 710, an optional feedback barrier 715, a preamplifier 720 and a tapered amplifier 730. The feedback insensitive oscillator, which may be state machine CHDL as previously described, includes a laser cavity 714 sandwiched between a reflector 712 and a high reflectivity output mirror 716. The frequency chirp of such an oscillator can be controlled precisely using the techniques described above. Insensitivity to optical feedback is achieved by increasing the reflectivity of the output mirror 716, which ensures that most of the light fed back towards the oscillator 710 from the preamplifier and amplifier 720, 730 does not affect the oscillation in the laser cavity 714. Increasing the reflectivity of the output mirror effectively incorporates the feedback barrier 715 into the output mirror 716. The increase in the reflectivity of the output mirror 716 will reduce the power output of the oscillator 710. The reduction of oscillator output power is made up by the use of the preamplifier 720 between the oscillator 710 and the flared/tapered amplifier 730 to boost the optical power. The same effect of reducing the amount of optical power fed backwards into the laser can also be achieved using an optical loss element (such as a coupler/splitter or an absorbing section) as the feedback barrier 715. This technique also reduces the optical power output of the oscillator, which can be compensated by the gain of the preamplifier 720.

With few exceptions, LIDAR systems can be segregated into staring systems and scanning systems. In a staring LIDAR, the transmitted laser beam illuminates the entire scene to be imaged. Reflections from the entire scene are imaged onto a detector array, with each detector element in the array corresponding to respective pixel in the scene. A staring coherent LIDAR must spread the reflected and LO beam over the entire detector array, which leads to insufficient signal-to-noise ratio unless the available laser power is very high. Thus, coherent LIDAR systems typically use an optical system to scan the transmitted bean sequentially over the scene.

A coherent receiver for a coherent LIDAR system employing a scanning transmitted beam has a fundamental architectural challenge. A transmitted beam having a beam diameter D0 is scanned across the scene within a wide field of view Θ. The scanning is typically performed in two dimensions. However, the subsequent figures only show scanning in one direction for ease of representation. The same design can be easily extended to two-dimensional scanning. The size of the transmitted beam, D0, is determined by the size of the scanning optic and the required angular resolution (typical values of D0 are 1-3 mm). The coherent receiver has to modally overlap the received photons from the target with the LO wave on a photodetector. One solution for the coherent receiver is to use an imaging lens that images the entire field of view Θ on a fixed detector or detector array, and illuminate the entire detector area, whether it is a single large detector or a detector array, with the LO at all times. However, since only a fraction of the field of view is imaged at any given time (this fraction can be $1/10^5$ or smaller), this leads to an inefficient use of LO power and detector area, and can result in very poor signal to noise ratio due to LO shot noise. Thus the receiver in a typical coherent LIDAR is typically scanned along with the transmitted beam. In other words, the LO beam needs to be mode-matched with the return beam from the scene as different parts of the field of view are illuminated.

Figure 8:
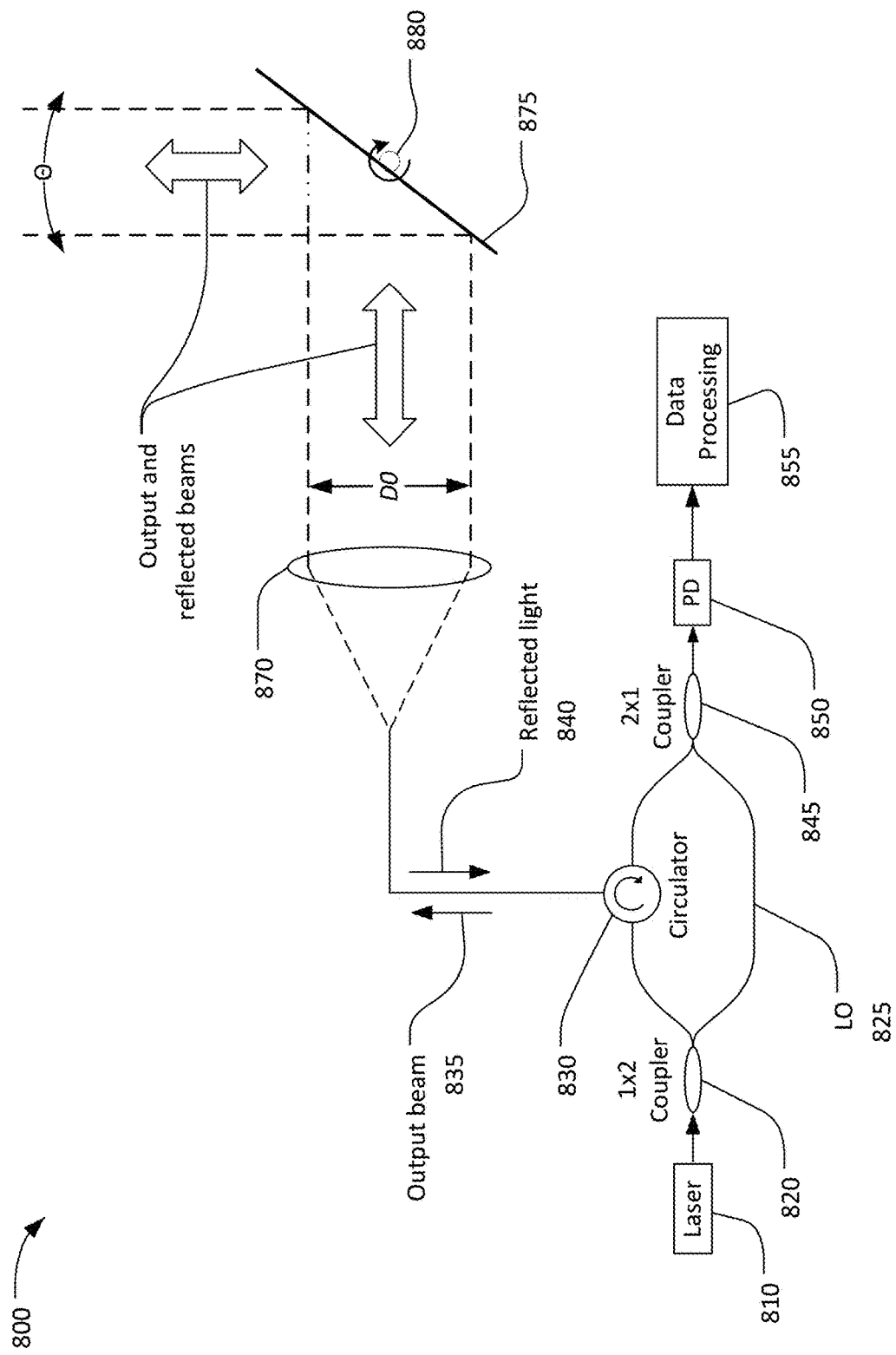
FIG. 8 is a block diagram of a scanning coherent LIDAR system.

The effective collection aperture of the coherent receiver, D1, is dictated by the requirement to collect enough photons from the target to make a high-SNR measurement. With a sufficiently high-power laser, D1=D0, which is to say the transmitted beam diameter and the receiver collection aperture may be the same. In this case, the LIDAR optical system can be a simple "cat's-eye" configuration (so-called because the transmitted and reflected light propagate in opposing directions along the same optical path, as is the case with light reflected from the eyes of a cat) where the return beam from the target retraces the optical path of the transmitted beam, as in the coherent LIDAR system 800 shown in FIG. 8.

In the LIDAR system 800, elements with reference designators from 810 to 855 have the same function as the counterpart elements in the LIDAR system 100 and will not be further described. The laser beam (other than the fraction extracted for the LO) is output from the circulator 830 and expanded/collimated by lens 870 to form an output beam having diameter D0. The lens 870, and all lenses in subsequent drawings, are depicted as single refractive lens elements but may be any combination of refractive, reflective, and/or diffractive elements to perform the required function. The output beam impinges upon scanning mirror 875, which can be rotated about an axis 880. The scanning mirror 875 may be, for example, a MEMS (micro-electro-mechanical system) mirror capable of high speed scanning. Rotation of the scanning mirror causes the output beam to scan across the scene through a field of view Θ.

Light reflected from the target impinges upon the scanning mirror 875 and is directed to the optic 870. Optic 870 captures (i.e., focuses) the reflected light, which is directed to the circulator 830. The captured reflected light exits the circulator 830 and is combined with the LO beam and detected as previously described. The diameter D0 of the transmitted beam and the collection aperture of the receiver are defined by the optic 870. Increasing the diameter of the transmitted beam correspondingly increases the diameter of the receiver aperture (and thus the number of received photons) at the expense of increasing the size of the optic 870 and the scanning mirror 875. The requirement for high speed scanning over the field of view limits the allowable size of the mirror. The transmitted beam diameter of scanning LIDAR systems is typically limited to 1 mm to 3 mm.

In the absence of a very high-power laser, the necessary diameter of the receiver aperture D1 is preferably larger than the transmitted beam diameter D0, and the challenge is to ensure mode overlap between the received beam and the LO beam at the detector with sufficient signal-to-noise ratio.

Figure 9:
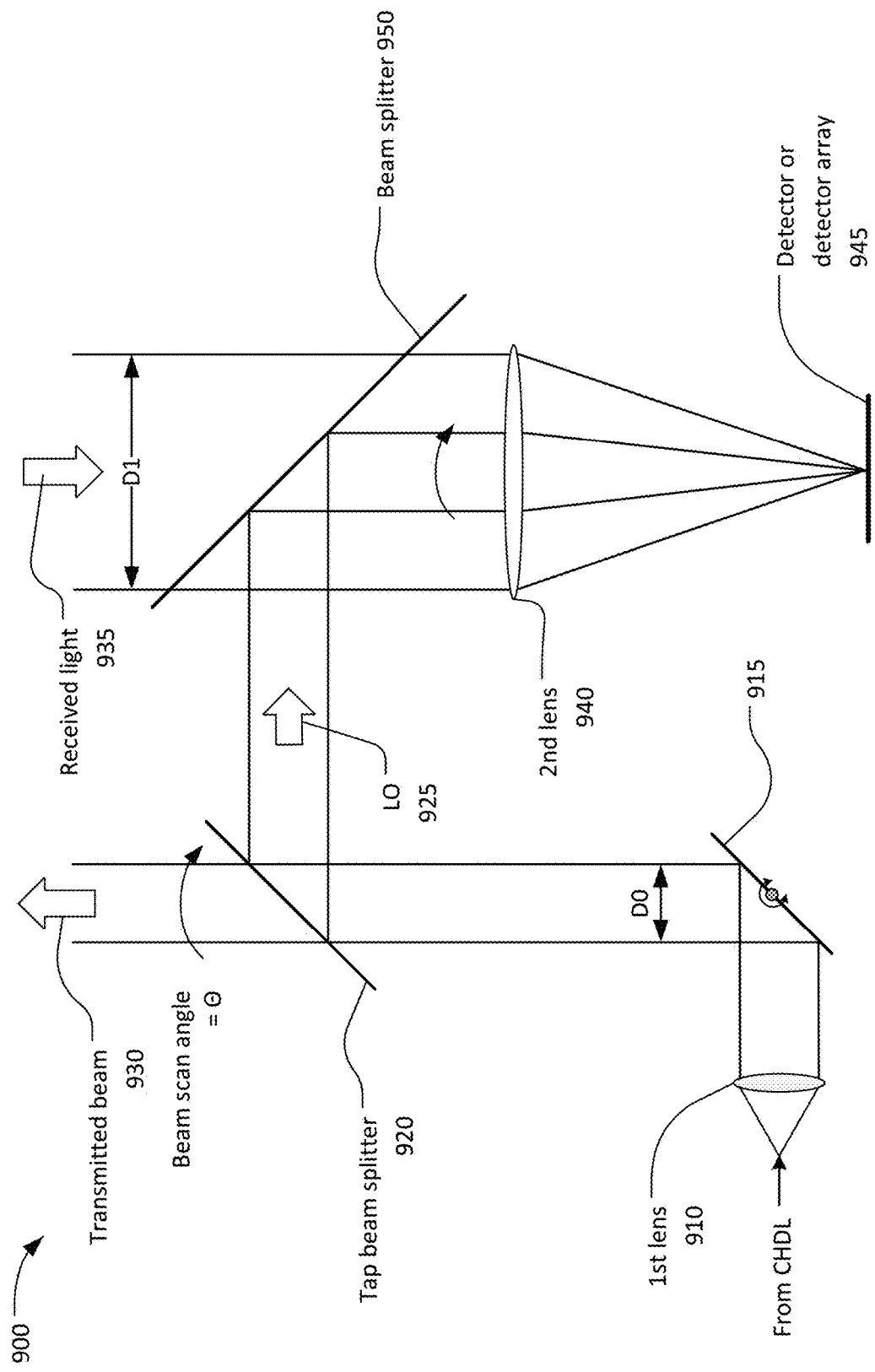
FIG. 9 is a block diagram of a scanning optical subsystem for use in a coherent LIDAR system.

FIG. 9 is a schematic diagram of an optical system 900 for a scanning coherent LIDAR system in which a diameter D1 of a receiver collection aperture may be substantially larger than a diameter D0 of a transmitted beam 930. A first lens 910 receives light from a CHDL and forms a collimated beam with a diameter D0. The collimated beam impinges on a scanning mirror 915 which is rotated to cause the beam to scan over a total scan angle Θ. A second lens 940 having a diameter D1, where D1>D0, receives reflected light 935 from a target scene and forms an image of the target scene on a detector array or a single detector. In either case, an area of the detector array or single detector is equal to or larger than the scene image formed by the second lens 940. The use of a detector array instead of a single detector ensures that the detector has a low enough capacitance to achieve the required bandwidth. Each detector in a detector array corresponds to a pixel in the scene and only one detector in the array is active for any given scan angle. At any given instant, the reflected light 935 received by the second lens 940 originates at a point in the target scene that is illuminated by the transmitted beam 930. Thus, as the angle of the transmitted beam 930 is changed, the received light is focused to a spot that movies laterally in the focal plane of the second lens 940 (i.e., across the plane of the detector 945). In systems with two-dimensional scanning of the transmitted beam, the spot of received light will scan in two dimensions across the detector 945. Since the target is illuminated with a smaller beam than the collection optic, the spot size at the plane of the detector for a given angle of illumination is larger than the resolution-limited spot size of the lens.

To achieve coherent detection of the reflected light, it is necessary that the LO beam and the received light be superimposed at the detector. It is possible to achieve this with an LO beam that illuminates the entire detector 945. Since the received light forms a spot that scans across the detector 945 as the transmitted beams is scanned across the scene, it is advantageous for the LO beam to instead scan across the detector 945 in a corresponding manner. To this end, a portion of the transmitted beam is extracted by a tap beam splitter 920 to form the LO beam 925. The LO beam is then combined with the received light 935 by a second beam splitter 950. Since the LO beam 925 is extracted from the transmitted beam 930 as it is scanned, the angle of the LO beam changes in conjunction with the scanning of the transmitted beam. The tap beam splitter 920 and beam splitter 950 effectively form a corner reflector such that the LO beam is parallel to the received light when the LO and received beams are combined. Thus, the second lens 940 focuses the LO beam to a spot that superimposed on the spot of received light at the detector 945.

Figure 10:
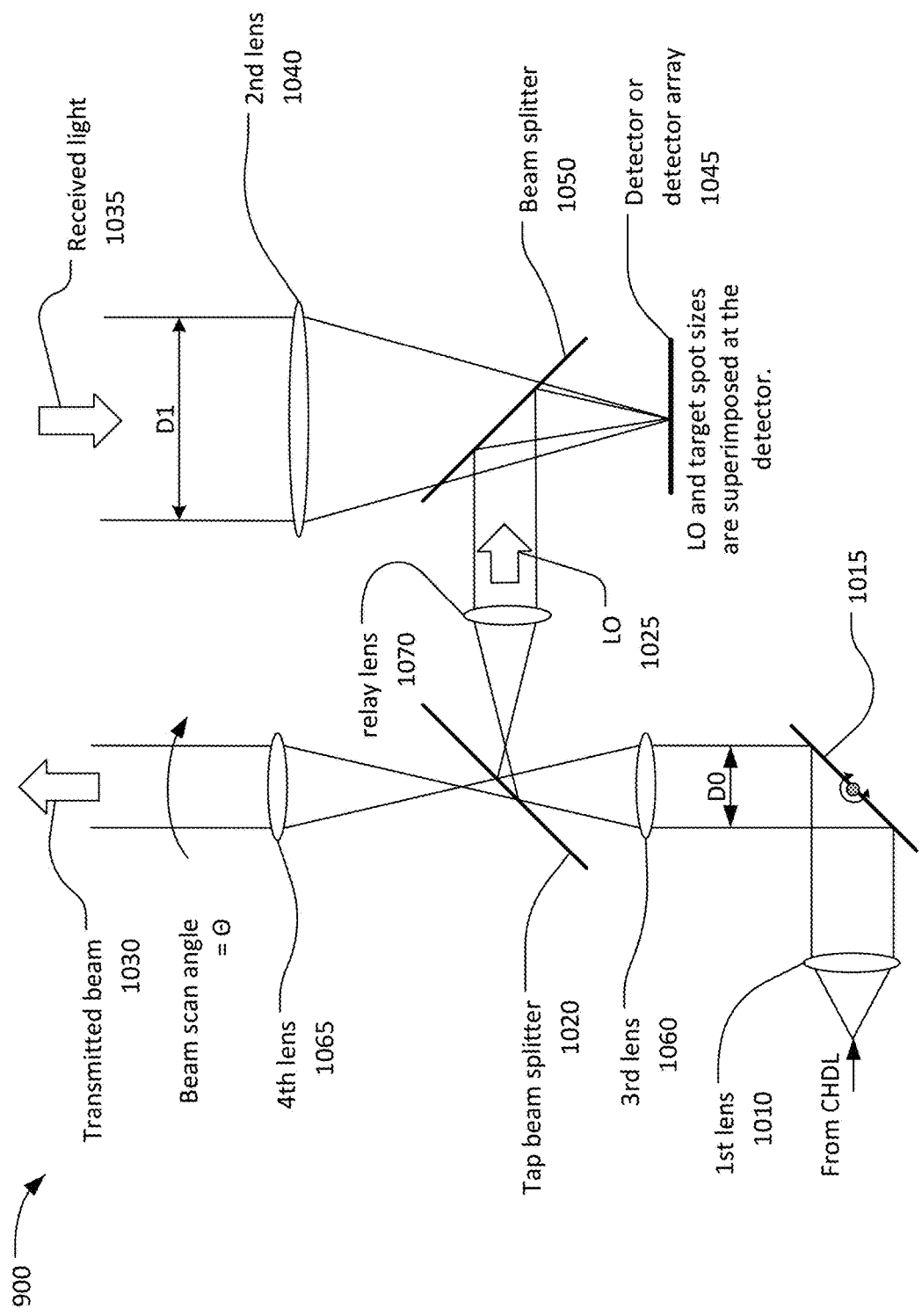
FIG. 10 is a block diagram of another scanning optical subsystem for use in a coherent LIDAR system.

FIG. 10 is a schematic diagram of another optical system 1000 for a scanning coherent LIDAR system in which a diameter D1 of a receiver collection aperture may be substantially larger than a diameter D0 of a transmitted beam 1030. A first lens 1010 receives light from a CHDL and forms a collimated beam with a diameter D0. The collimated beam impinges on a scanning mirror 1015 which is rotated to cause the beam to scan over a total scan angle Θ. A second lens 1040 having a diameter D1, where D1>D0, receives reflected light 1035 from a target scene and forms an image of the target scene on a detector array or a single detector as previously described. At any given instant, the reflected light 1035 received by the second lens 1040 forms a spot that scans across the detector 1045 as previously described in conjunction with FIG. 9.

A third lens 1060 and a fourth lens 1065 form a 1:1 telescope that relays the transmitted beam 1030 from the scanning mirror 1015 to the scene. A portion of the transmitted beam is extracted by a tap beam splitter 1020 between the third and fourth lenses 1060, 1065 to form the LO beam 1025. The LO beam and the received light 1035 are combined by a second beam splitter 1050. A relay lens 1070 in the path of the LO beam focuses the LO beam to a spot at the plane of the detector 1045. When the focal lengths of the third lens 1060 and the further lens 1065 are equal to the focal length of the second lens 1040, the focused spot of the LO beam will have the same size as the focused spot of received light.

While FIG. 9 and FIG. 10 illustrate coherent LIDAR systems using separate optical paths for the transmitter and receiver, a system with a single set of optics in the cat's-eye configuration minimizes the complexity of the photodetector and associated electronics complexity. However, to allow the use of a large receiver aperture, the illumination beam needs to be transformed from a first beam diameter D0 (which can be constrained by the practical size of the scanning mirror) to a second beam diameter D1>D0 (and vice versa for the reflected light returning through the same optical path) without compromising the total field of view Θ.

The number of optical modes, or unique angular positions, a beam can assume within a field of view is determined by the angular resolution of the beam. A beam with diameter D0 has an angular resolution ~λ/D0 (ignoring constant scaling factors of order unity throughout this discussion). Therefore a beam with diameter D0 can be scanned to fill out a certain number of optical modes N0~Θ*D0/λ within the field of view Θ. When a scanned beam of diameter D0 is optically transformed into a new beam with a diameter D1, the angular resolution of the new beam will be ~λ/MD0, where M=D1/D0 is the magnification factor. However, the total number of available optical modes remains constant when the diameter of the beam is magnified. A simple telescope that magnifies the beam diameter from D0 to D1 will reduce the total field of view from Θ to Θ/M to conserve the number of optical modes.

After the beam diameter is magnified to D1, the scanner will provide N0 modes, with an angular resolution of λ/MD0, distributed over a field of view of Θ/M. To recover the original field of view, the N0 modes must be spaced apart with an angular distance between adjacent modes of λ/D0, such that the N0 modes are sparsely distributed across the field of view Θ. This means that only a portion of each scene resolution element is illuminated as the transmitted beam is scanned over the scene. Practically this means that the LIDAR system images the same total field of view in the same measurement time by trading off scene pixel fill factor for an increase in the received optical power.

A mode transformer may be used to transform a set of N0 closely spaced modes spanning a field of view Θ/M into a set of N0 modes that sparsely sample a field of view Θ. For example, a mode transformer can be implemented by coupling each available mode into a respective single mode optical fiber, and then moving the fibers apart from each other to "sparsify" the modes. A collimating lens can then be used to convert the light from each optical fiber into a D1-sized beam.

Figure 11:
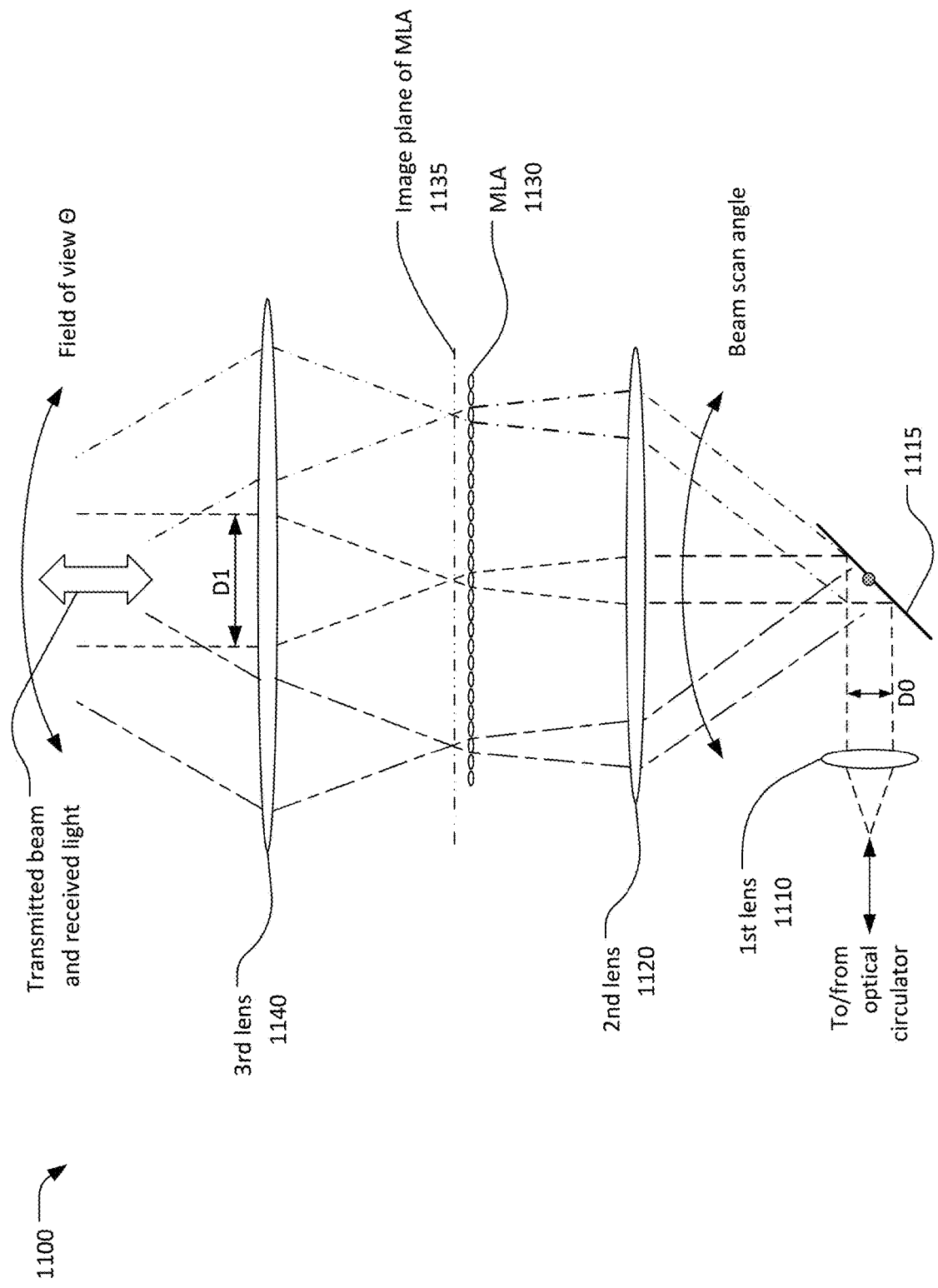
FIG. 11 is a block diagram of another scanning optical subsystem for use in a coherent LIDAR system.

Another practical embodiment of a mode converter uses a microlens array. FIG. 11 is a schematic diagram of an optical system 1100 for a scanning coherent LIDAR system in which the available modes are distributed sparsely over the entire field of view Θ. A first lens 1110 receives light from a circulator, such as the circulator 130 in FIG. 1, and forms a collimated beam with a diameter D0. The collimated beam is incident on a scanning mirror 1115 which rotates to scan the collimated beam through a scan angle corresponding to the field of view Θ. A second lens 1120 receives the scanning beam from the scan mirror 1115 and creates a moving array of spots at its focal plane. A microlens array (MLA) 1030 is placed at this focal plane, with each microlens matched to the spot size formed by the scanning beam passing through the second lens 1120. Each element of the microlens array 1030 then converts (further focuses) the spot incident on it, thereby creating a sparse array of smaller spots at an image plan 1135 of the MLA. A third lens 1040 then collimates light from the array of smaller spots into a sparse, but now fully angularly-swept beam of larger size D1. The effective speeds (i.e., focal length divided by diameter, or f-number) of the microlenses and the third lens are matched. Reflected light received from the scene follows the reverse path to return to the circulator. Thus, the optical system 1100 creates an array of spots that samples the full angular field of view Θ at the angular resolution of the initial beam of size D0, while collecting more target photons corresponding to the larger beam size D1.

When the focal lengths of the second lens 1120 and the third lens 1140 are the equal, the field of view Θ will be equal to the beam scan angle. When the focal lengths of the second and third lenses 1120, 1140 are unequal the field of view can be expanded or compressed compared to the beam scan angle.

Figure 12:
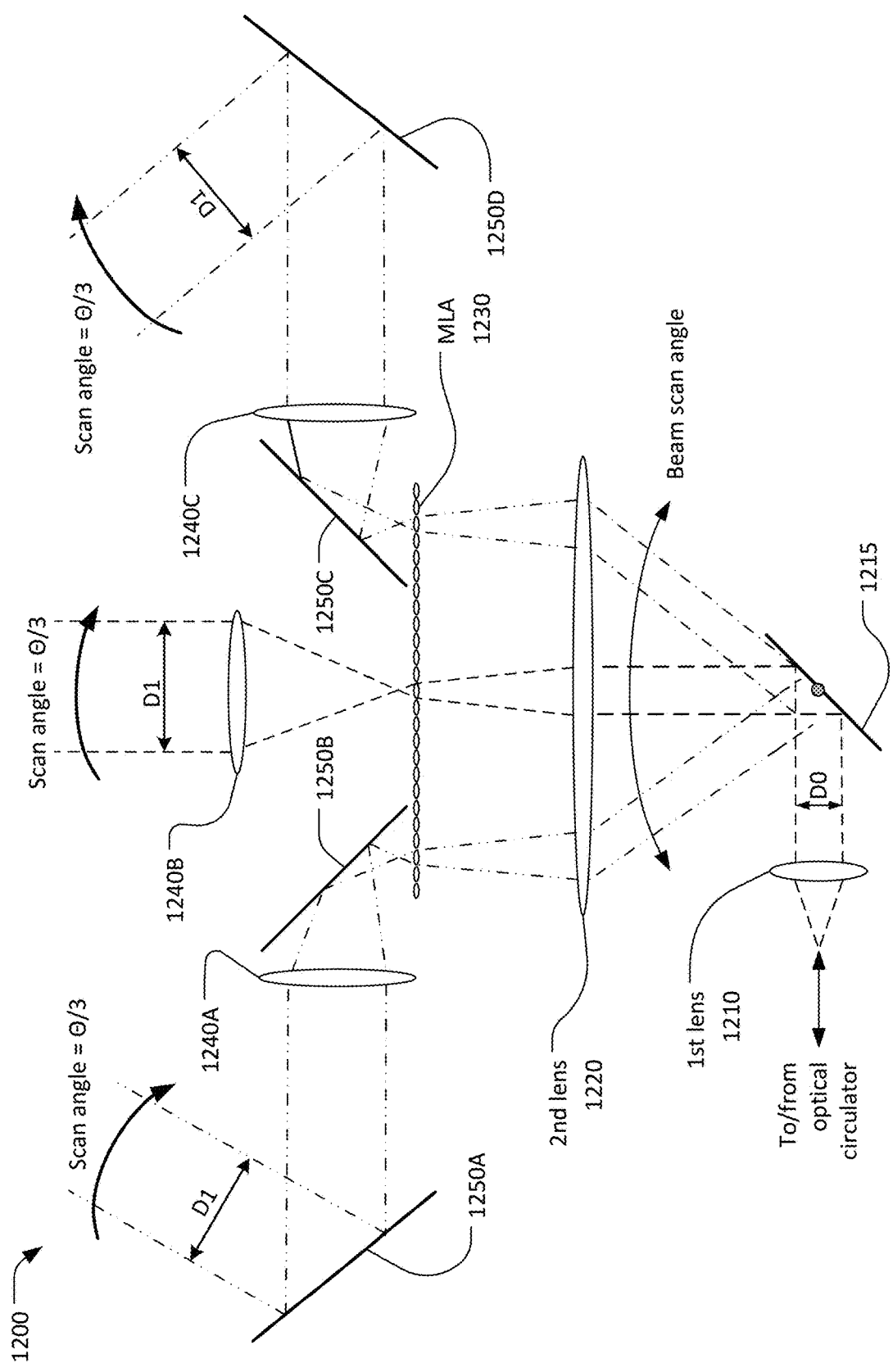
FIG. 12 is a block diagram of another scanning optical subsystem for use in a coherent LIDAR system.

The optical system 1100 of FIG. 11 includes a wide-field of view third lens 1140 to form a scanning beam of diameter D1 and to collect photons from the full field of view. FIG. 12 is a schematic diagram of an optical system 1200 in which the large lens 1140 of FIG. 11 is replaced by three smaller lenses 1240A, 1240B, 1240C that each create D1-sized beams that only scan over one-third of the total field of view Θ. Folding mirrors 1250A, 1250B, 1250C, 1250D are used to "combine" the fields-of-view of the three lenses 1240A, 1240B, 1240C to achieve the full angular field of view Θ. Other elements of the optical system 1200 have the same function as the corresponding elements in the optical system 1100. The optical system 1200 has the advantage of using smaller optics and reducing overall system complexity by taking advantage of the fact that the size and complexity of optical elements tend to scale non-linearly with the field of view. A different number of smaller lenses (rather than three), or different relay optics can be used instead (other than folding mirrors), to achieve the same desired result. In addition, by placing the folding mirrors 1250B, 1250C before the microlens array 1230, the large microlens array 1230 may be replaced by three smaller microlens arrays to achieve the same desired result, using appropriate relay optics.

Coherent LIDAR measures the amplitude and phase of the electromagnetic field reflected from the target. This reflected field is strongly influenced by surface irregularities on the target within the illuminated spot. These irregularities result in random variations in the amplitude and phase of the reflected field, commonly known as speckle. In most practical cases, the intensity of the reflected field has an exponential probability distribution and the phase has a uniform probability distribution. This means that even a bright target can occasionally have a low intensity and may be below the detection threshold of the LIDAR system. The spatial scale of the speckle variations is given by the resolution of the receiver optics. For example, in a conventional coherent LIDAR system, if the angular resolution of the LIDAR system is 0.1 degrees, the amplitude and phase of the speckle pattern change every 0.1 degrees.

The probabilistic nature of target reflections also occurs in RADAR systems, and techniques for RADAR detection of so-called "fluctuating targets" have been developed. These techniques rely on multiple RADAR measurements of the target to overcome the target strength (and phase) fluctuations. These measurements are then coherently or incoherently "integrated" to overcome the negative effects of target fluctuations. Integration refers to the process of combining multiple measurements to extract range and/or Doppler measurements, and can provide a higher probability of detection of the target for a given signal to noise ratio of the measurements. The process of incoherent integration ignores the optical phase of the reflected field, whereas coherent integration utilizes the phase information. The process of integration works best if the multiple measurements being integrated are in some way uncorrelated from each other, so that the target fluctuations can be "averaged" out. Speckle in a LIDAR system is comparable to a fluctuating target in a RADAR system, and similar mathematical techniques can be applied to mitigate the effects of speckle. However, the goal of a high-speed coherent LIDAR system is to obtain range and Doppler information from every scene pixel in a single scan of the field of view. Thus integration over multiple scans, as used in RADAR systems, cannot be directly applied to a LIDAR system.

Figure 13B:
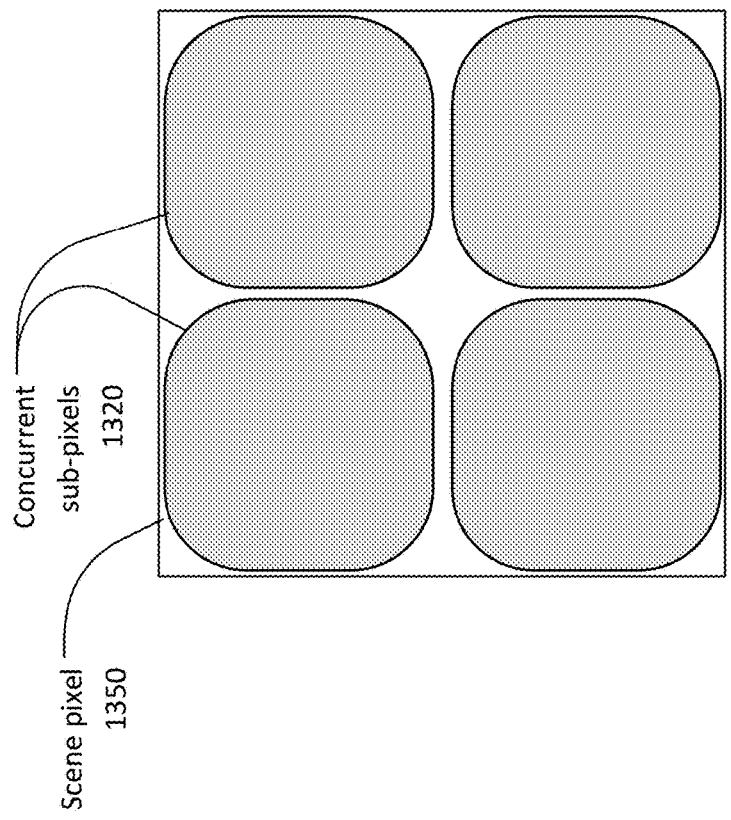
FIG. 13B is a graphical representation of spatial oversampling.
Figure 13A:
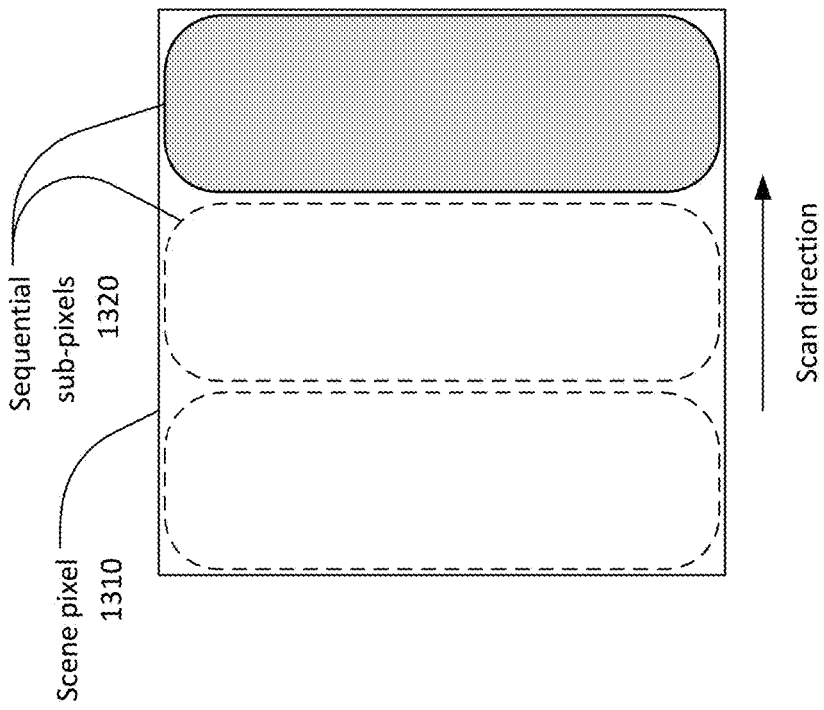
FIG. 13A is a graphical representation of temporal oversampling.

The key to speckle mitigation in LIDAR systems is to obtain multiple measurements over each scene pixel during each scan of the field of view, and then coherently or incoherently integrate (combine) these measurements to mitigate target fluctuations (speckle). FIG. 13A and FIG. 13B illustrate two approaches to obtain the multiple measurements. The common idea behind both approaches is to divide the pixel into N subpixels, perform separate LIDAR measurements on the subpixels, and coherently or incoherently integrate these measurements to provide a composite measurement for the pixel.

In the first approach shown in FIG. 13A, each scene pixel 1310 is partitioned into N subpixels 1320, where N is an integer greater than one, that are measured sequentially. In the example of FIG. 13A, N=3. Each subpixel is measured using an illumination beam that is scanned across the pixel during the pixel measurement time $T_M$ (as defined in FIG. 1). The angular size of the illumination beam determines the subpixel size. A one-dimensional scan is shown in FIG. 13A for simplicity, but other scanning patterns are possible. N separate LIDAR measurements are sequentially performed over these subpixels (each measurement takes time $T_M/N$), and these measurements are coherently or incoherently integrated to determine the range and/or range-rate of the pixel. A beam with a narrower angular size than the desired pixel size can be implemented in multiple ways, e.g., by using a scanning element with a larger aperture in the LIDAR system, or by using a magnifying optic such as a telescope or a diffraction grating to increase the size of the beam while using a scanner with a small aperture. Note that the (near-field) size of the beam at the LIDAR transmitter/receiver is inversely proportional to the angular size of the beam in the far field (i.e., at the target).

Alternatively, the LIDAR measurements on N subpixels within a pixel can be performed simultaneously and in parallel, as illustrated in FIG. 13B. In this example, N=4. The N subpixels are simultaneously illuminated and imaged on different photodetectors to obtain N different LIDAR measurements (range and/or range-rate). In this case, each measurement is performed over the full pixel measurement time $T_M$. The N measurements are coherently or incoherently integrated to provide a composite range and/or range-rate of the pixel.

A hybrid of the techniques shown in FIG. 13A and FIG. 13B is also possible. For example, a pixel may be divided into four subpixels (as in FIG. 13B) which are scanned in two horizontal (as shown in FIG. 13A) steps by two vertically-offset beams.

Figure 14:
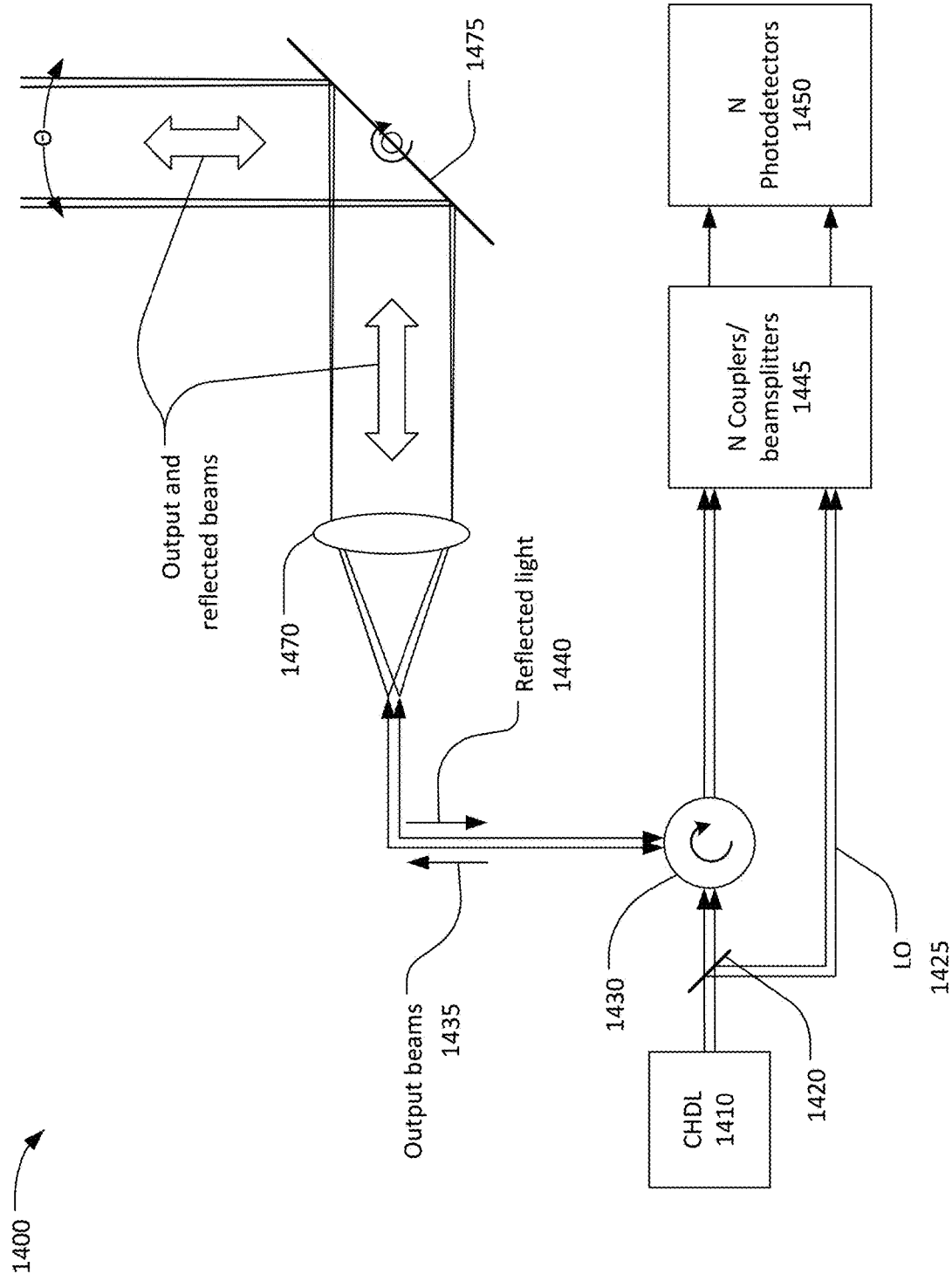
FIG. 14 is a block diagram of a coherent LIDAR system using spatial oversampling.

FIG. 14 is a schematic diagram of a coherent LIDAR system 1400 that performs simultaneous measurements of N subpixels within each pixel. The system 1400 is similar to the LIDAR system 800 of FIG. 8, but with N beams propagating in parallel though much of the system.

The output of a CHDL 1410 is divided into N parallel beams. A tap coupler 1420 is used to extract a small fraction of each beam as a respective LO beam. The majority (typically >90%) of each CHDL beam is directed toward a target via an N-channel circulator 1430. The N-channel circulator may be, for example, implemented using discrete optical elements (e.g. known combinations of polarizing beam splitters and a Faraday rotator) such that N beams can pass through the circulator in parallel. A lens 1470 converts the N output beams 1435 from the circulator 1430 into N collimated output beams at slightly different angles such that the N beams illuminate N subpixels within a target pixel, as shown in FIG. 13B. The N output beams are scanned across a field of view by a scanning mirror 1475.

The lens 1470 collects light reflected from the target (not shown) and forms the reflected light into N received light beams 1440. The received light beams separated from the output beams by the circulator 1430 and are combined with respective LO beams by N couplers or beamsplitters 1445. The combined LO waves and the received light beams from the target are respectively incident on N photodetectors 1450. The N photodetectors 1450 provide respective measurements indicative of the range and range rate of respective subpixels, as previously described. A processor (not shown) coherently or incoherently combines the N subpixel measurements to provide a composite range and/or range rate measurement for the pixel.

Figure 15:
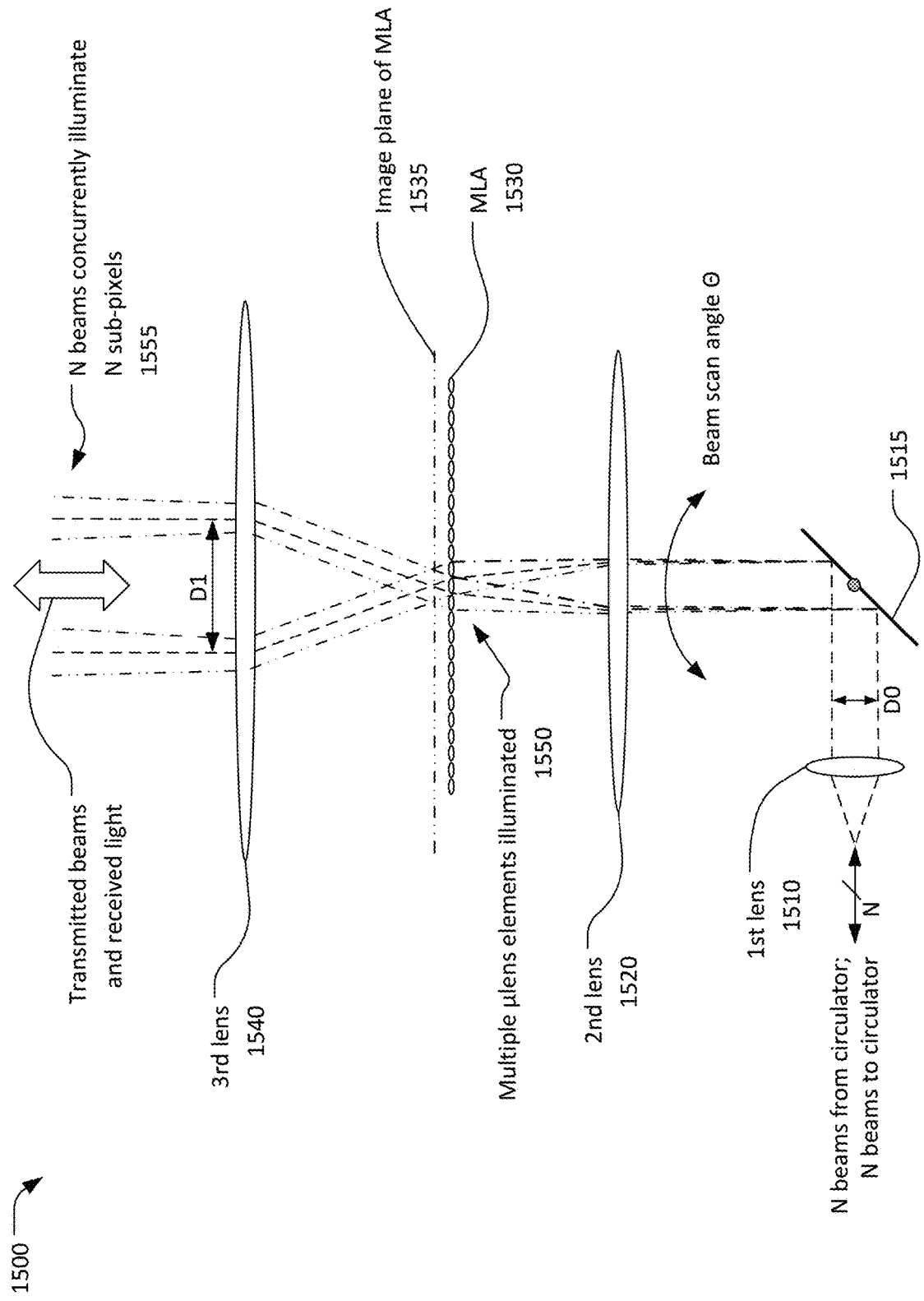
FIG. 15 is a block diagram of a scanning optical subsystem for use in a coherent LIDAR system with spatial over-sampling.

FIG. 15 is a block diagram of a scanning optical 1500 system for a LIDAR that that performs simultaneous measurements of N subpixels within each pixel. The optical system 1500 is similar to the optical system 1100 of FIG. 11, but with N beams propagating in parallel though much of the system.

A first lens 1510 receives N beams from a circulator, such as the circulator 1430 in FIG. 14, and forms N collimated beams with diameter D0. The collimated beams are incident on a scanning mirror 1515 at slightly different angles (not shown). The scanning mirror 1515 rotates to scan the N collimated beams through a scan angle corresponding to the field of view Θ. A second lens 1520 receives the N scanning beams from the scan mirror 1515 and creates a moving array of spots at its focal plane. A microlens array (MLA) 1530 is placed at this focal plane. The N beams from the circulator are configured such that each beam illuminates a single microlens in the MLA, and N microlenses are together illuminated. As a result, N smaller spots are formed at the image plane 1535 of the MLA. These N spots are formed into N slightly offset beams by the third lens 1540 that simultaneously illuminate N subpixels of the scene. A single beam from the circulator, with a different size, can be used instead of the N beams, to achieve the desired goal of simultaneously illuminating N microlenses after passing through the first lens 1510, scanning element 1515 and second lens 1520.

The reflected light from these N subpixels is received by the third lens and propagates through the scanning optical system 1500 in the reverse direction, which results in N separate beams returned to the circulator, as was the case in the LIDAR system 1400 of FIG. 14. As previously described in conjunction with FIG. 14, the N beams of reflected light are then combined with respective LO beams. The combined beams are respectively incident on N photodetectors that provide respective measurements indicative of the range and range rate of respective subpixels. A processor (not shown) coherently or incoherently combines the N subpixel measurements to provide a composite range and/or range rate measurement for the pixel.

A high-resolution coherent LIDAR or imaging system has two important components: i) a swept-frequency laser or "chirped laser" with a large frequency sweep range B to provide high axial resolution at the range of interest; and ii) a technique to translate the one-pixel (fixed (x,y)) measurement laterally in two dimensions to obtain a full 3-D image.

Coherent LIDAR systems for 3-D imaging typically rely on the scanning of a one-pixel measurement across the scene to be image. Examples of scanning LIDAR systems were previously shown in FIGS. 8, 9, 10, 11, 12, 14 and 15.

An alternative to scanning LIDAR systems is a staring system consisting of a swept frequency laser, and a detection technique that is capable of capturing or measuring the 3-D image of a scene, or a multi-pixel portion of a scene concurrently. Such a system has the potential to be inexpensive, robust, and contain no moving parts.

Figure 16A:
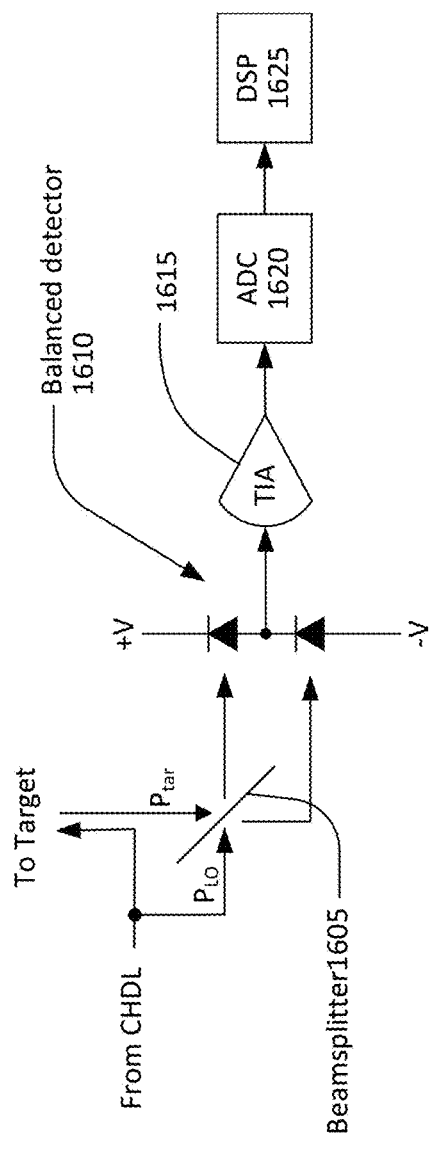
FIG. 16A is a block diagram of a single element is a staring coherent LIDAR system.

FIG. 16A is a block diagram of one pixel of the detection side of a staring coherent LIDAR. A local oscillator beam having beam power of $P_{LO}$ and reflected light from a target pixel having power $P_{tar}$ are combined by a beam splitter. A balanced detector pair 1610 may be used to obtain a high dynamic range. The output of the balanced detector 1610 is amplified using a transimpedance amplifier (TIA) 1615, digitized using an analog-to-digital converter (ADC) 1620, and the spectrum of the photocurrent signal is calculated by a Digital Signal Processor (DSP) 1625 using a Fourier transform. The DSP 1625 may be on the chip containing the TIA 1615 and ADC 1620, or external to the chip. While the basic output from a measurement of a single pixel are two values corresponding to the strength (reflectivity) and range of the target at the pixel, further data processing to enhance the signal (e.g., thresholding, filtering, interpolation etc.) are also possible.

Figure 16B:
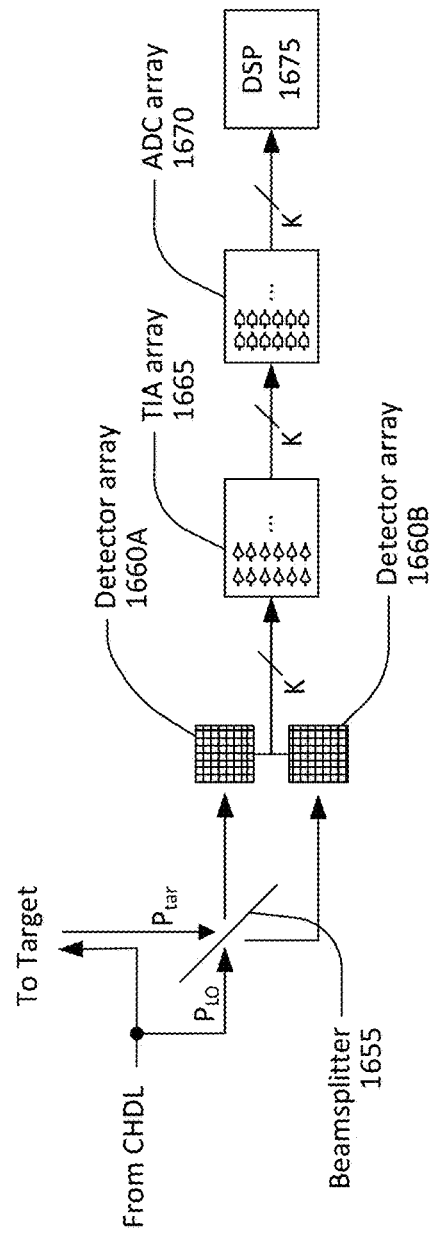
FIG. 16B is a block diagram of a staring LIDAR system.

This single pixel detector described above is extended to an N-element array (one-dimensional or two-dimensional) to implement the full-field 3-D imaging system as shown in FIG. 16B and FIG. 16B is a block diagram of a receiver array for full-field 3-D imaging where K pixels of the scene are simultaneously imaged. Two aligned detector arrays 1660A 1660B are used to perform the optical balancing. Each detector array contains K detectors to perform simultaneous measurements on K pixels of the scene. The detector arrays 1660A, 1660B may be located on separate chips/wafers or on a single wafer (using an external flip mirror or equivalent to align the two outputs of the beam splitter on the two detector arrays). Alternatively, other balancing approaches may be implemented with a single photodetector array, e.g., using phase shifters, or polarization optics and pixelated polarizers, on adjacent pixels to introduce a it-phase shift on the LO or the target beam. The addition of a it-phase shift in one of LO or target arms simulates a balanced detection scheme. An unbalanced single detector array can also be used to perform the measurement, but this may limit the dynamic range of the system. The dynamic range can be improved by subtracting the common mode current from the photodetector using an external current source.

The output of the detector arrays (whether K single detectors or 2K detectors to form K balanced pairs) is amplified with an array of TIAs 1665, digitized with an array of ADCs 1670, and one or more signal processors 1675 performs the Fourier transforms (typically using the FFT algorithm), the detection algorithms, and the input/output communication. The output of receiver array is typically two "images" (i.e., two values per pixel) corresponding to the depth map and the intensity of the reflections. Measuring the scene with alternate up- and down-chirps will also allow measuring the range rate of each scene pixel. Further data processing algorithms may also be implemented by the smart detector array or external processors.

The various electronic components (detectors, TIAs, ADCs and signal processors) may be fully integrated on the same wafer substrate, e.g., silicon electronics with silicon or silicon-germanium detectors, or III-V semiconductor detectors and electronics. Alternatively, hybrid integration may be used where dies with different functionalities (detectors, amplifiers, mixed-mode circuits etc.) are incorporated on the substrate using pick-and-place techniques. Different functional elements may be spatially separated as shown schematically in this figure, or may be implemented as "composite pixels" that incorporate these different functional elements in close proximity to each other as shown in FIG. 17.

Figure 17:
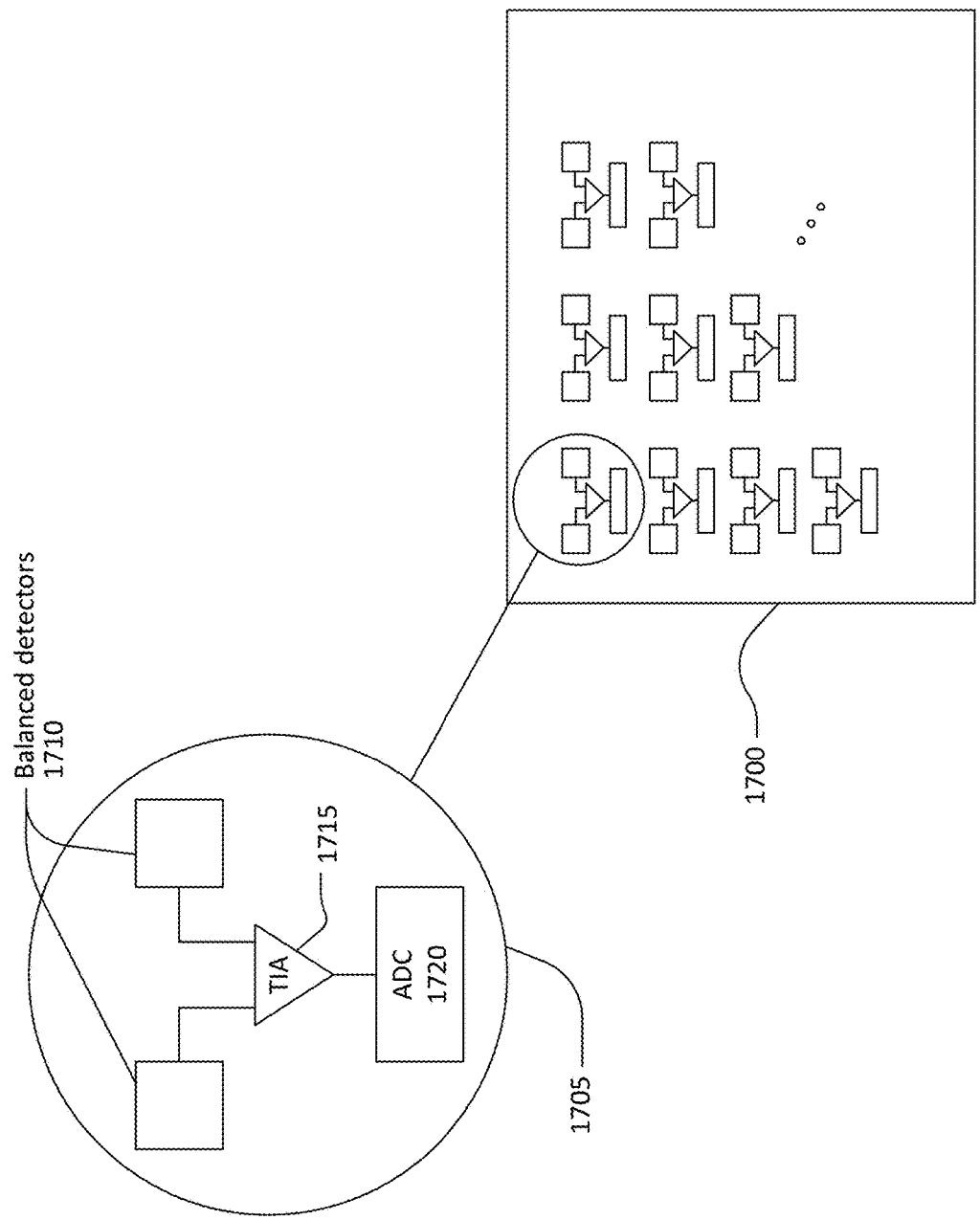
FIG. 17 is a depiction of a staring LIDAR sensor array integrated on a single chip.

FIG. 17 is a block diagram of an alternative implementation of a receiver array 1700 where the detectors 1710, TIA 1715, ADC 1720, and other electronic components are integrated, monolithically or using hybrid integration, in close proximity to form a series of functional unit cells 1705. As shown in FIG. 17, two adjacent detectors 1710 are used for balancing. This approach can be readily modified to use a single detector per unit cell, or the unit cell may only contain some functional blocks, with the remaining functions being performed separately.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A frequency modulated laser, comprising:
a laser source to emit an optical beam, wherein an optical frequency of the optical beam changes in response to at least one signal applied to at least one input of the laser source;
a laser driver to generate the at least one signal to cause the optical frequency to vary in accordance with a periodic frequency versus time function; and
an error determination module to determine a respective error between each period of the periodic frequency versus time function and a target frequency versus time function,
wherein the laser driver generates the at least one signal for a current period of the periodic frequency versus time function based, at least in part, on optical frequency versus time measurements of one or more prior periods of the periodic frequency versus time function, the determined error for one or more prior periods of the periodic frequency versus time function, and a weighted sum of the determined errors for two or more prior periods of the periodic frequency versus time function.

2. The frequency modulated laser of claim 1, wherein:
the laser source is a semiconductor laser diode, and
the at least one signal is a drive current.

3. The frequency modulated laser of claim 1, wherein the periodic frequency versus time function is one of a linear triangular function and a linear sawtooth function.

4. The frequency modulated laser of claim 1, further comprising:
an optical tap to extract a portion of the optical beam; and
an optical frequency discriminator to make the optical frequency versus time measurements of the extracted portion of the optical beam.

5. The frequency modulated laser of claim 4, wherein the frequency discriminator is an asymmetric Mach-Zehnder interferometer and a photodetector.

6. The frequency modulated laser of claim 1, wherein the laser driver generates the at least one signal for a current period of the periodic frequency versus time function based, at least in part, on digital or analog filtering of the determined errors for two or more prior periods of the periodic frequency versus time function.

7. The frequency modulated laser of claim 1, wherein the laser driver generates the at least one signal for a current period of the periodic frequency versus time function based, at least in part, on measurements of at least one environmental condition.

8. The frequency modulated laser of claim 7, wherein the at least one environmental condition includes a temperature of the laser source.

9. The A frequency modulated laser comprising:
a laser source to emit an optical beam, wherein an optical frequency of the optical beam changes in response to at least one signal applied to at least one input of the laser source;
a laser driver that generates the at least one signal to cause the optical frequency to vary in accordance with a periodic frequency versus time function, wherein the laser driver generates the at least one signal for a current period of the periodic frequency versus time function based, at least in part, on optical frequency versus time measurements of one or more prior periods of the periodic frequency versus time function;
an optical amplifier to amplify the optical beam emitted from the laser source; and
an optical feedback barrier to inhibit optical feedback from the optical amplifier to the laser source.

10. The frequency modulated laser of claim 9, wherein the optical feedback barrier is one or both of an attenuator and an optical isolator.

11. The frequency modulated laser of claim 9, wherein the optical feedback barrier is incorporated into an output coupler of the laser source.

12. The frequency modulated laser of claim 9, further comprising:
an optical preamplifier between the optical feedback barrier and the optical amplifier.

13. A coherent light detection and ranging (LIDAR) system, comprising:
a first frequency modulated laser to emit a first optical beam, wherein an optical frequency of the first optical beam varies in accordance with a first periodic frequency versus time function, wherein the first frequency modulated laser comprises:
a laser source to emit an optical beam, wherein an optical frequency of the optical beam changes in response to at least one signal applied to at least one input of the laser source,
a laser driver to generate the at least one signal to cause the optical frequency to vary in accordance with a periodic frequency versus time function, and
an error determination module to determine a respective error between each period of the periodic frequency versus time function and a target frequency versus time function,
wherein the laser driver generates the at least one signal for a current period of the periodic frequency versus time function based, at least in part, on optical frequency versus time measurements of one or more prior periods of the periodic frequency versus time function, the determined error for one or more prior periods of the periodic frequency versus time function, and a weighted sum of the determined errors for two or more prior periods of the periodic frequency versus time function;
a scanning optical system to scan the first optical beam over a scene; and
a measurement subsystem to measure range and/or range rate for pixels within the scene based on reflections of the first optical beam from the scene, wherein the measurement subsystem measures range and/or range rate for multiple pixels during each period of the first periodic frequency versus time function.

14. The coherent LIDAR system of claim 13, further comprising:
a second frequency modulated laser to emit a second optical beam, where an optical frequency of the second optical beam varies in accordance with a second periodic frequency versus time function, wherein
the scanning optical system scans the first and second optical beams simultaneously over the scene; and
the measurement subsystem measures range and/or range rate for pixels within the scene based on reflections of the first and second optical beams from the scene.

15. The coherent LIDAR system of claim 14, wherein the first periodic frequency versus time function is a positive sawtooth function, and the second periodic frequency versus time function is a negative sawtooth function.

16. The coherent LIDAR system of claim 14, wherein the first periodic frequency versus time function is a triangle function, and the second periodic frequency versus time function is a triangle function shifted by 180 degrees with respect to the first periodic frequency versus time function.

17. The coherent LIDAR system of claim 14, wherein the second frequency modulated laser comprises:
another laser source to emit a second optical beam, wherein an optical frequency of the second optical beam changes in response to at least one signal applied to at least one input of the other laser source; and
another laser driver to generate the at least one signal to cause the optical frequency of the second optical beam to vary in accordance with a second periodic frequency versus time function,
wherein the other laser driver generates the at least one signal for a current period of the second periodic frequency versus time function based, at least in part, on optical frequency versus time measurements of one or more prior periods of the second periodic frequency versus time function.

18. The frequency modulated laser of claim 9, further comprising:
an error determination module to determine a respective error between each period of the periodic frequency versus time function and a target frequency versus time function.

19. The frequency modulated laser of claim 18, wherein the laser driver generates the at least one signal for a current period of the periodic frequency versus time function based, at least in part, on the determined error for one or more prior periods of the periodic frequency versus time function.

20. The frequency modulated laser of claim 19, wherein the laser driver generates the at least one signal for a current period of the periodic frequency versus time function based, at least in part, on a weighted sum of the determined errors for two or more prior periods of the periodic frequency versus time function.

21. The frequency modulated laser of claim 19, wherein the laser driver generates the at least one signal for a current period of the periodic frequency versus time function based, at least in part, on digital or analog filtering of the determined errors for two or more prior periods of the periodic frequency versus time function.

22. The frequency modulated laser of claim 9, wherein the laser driver generates the at least one signal for a current period of the periodic frequency versus time function based, at least in part, on measurements of at least one environmental condition.

23. The frequency modulated laser of claim 22, wherein the at least one environmental condition includes a temperature of the laser source.

\* \* \* \* \*

UNITED STATES PATENT AND TRADEMARK OFFICE
CERTIFICATE OF CORRECTION

PATENT NO. : 11,187,807 B2  
APPLICATION NO. : 16/032535  
DATED : November 30, 2021  
INVENTOR(S) : Naresh Satyan et al.

Page 1 of 1

It is certified that error appears in the above-identified patent and that said Letters Patent is hereby corrected as shown below:

In the Claims

Column 18, Line 36, Claim 9: Please delete the word "The".

Signed and Sealed this  
Twelfth Day of April, 2022

Drew Hirshfeld  
*Performing the Functions and Duties of the*  
*Under Secretary of Commerce for Intellectual Property and*  
*Director of the United States Patent and Trademark Office*